United States Patent [19]

Morrow et al.

[11] 3,938,394
[45] Feb. 17, 1976

[54] COMBINATION BALANCE ANALYZER AND VIBRATION SPECTRUM ANALYZER

[75] Inventors: Robert S. Morrow, Columbus; Lloyd D. Penn, Johnstown, both of Ohio

[73] Assignee: IRD Mechanalysis, Inc., Columbus, Ohio

[22] Filed: Nov. 30, 1973

[21] Appl. No.: 420,594

[52] U.S. Cl. .............................................. 73/462
[51] Int. Cl.² ......................................... G01M 1/16
[58] Field of Search ............ 73/462, 71.4; 324/79 R

[56] References Cited
UNITED STATES PATENTS

| 3,307,408 | 3/1967 | Thomas et al. | 73/462 |
| 3,501,965 | 3/1970 | Morrow | 73/462 |
| 3,705,516 | 12/1972 | Reis | 73/71.4 |

OTHER PUBLICATIONS
"Electronics World" pp. 49 & 52 of June 1968.
"Frequency Analysis of Vibrations and Noise" from "The Panoramic Analyzer" by Panoramic Radio Products, Inc. (Oct. 1958).
"Design Considerations for a Vibration Meter" from "MB Vibration Notebook" Oct. 1960, pp. 5–7.

*Primary Examiner*—James J. Gill
*Attorney, Agent, or Firm*—Harry B. Keck; George E. Manias

[57] ABSTRACT

A combination electronic device provides balance analyzing capabilities, narrow band and wide band spectrum analysis capabilities, automatic tracking filtering capabilities, precision dynamic balancing with remote phase presentation, and tracking filtering. The device presents multiple functions including:
1. A testing function;
2. A balancing function;
3. A tracking filter function;
4. A filter-out-speed function;
5. A filter-out-frequency function;
6. Spectrum analysis function.

Included within the circuitry are the following components:
A. A vibration signal conditioning circuit;
B. An active filter having the equivalent of a four-pole response with a two-pole delay;
C. A pulse-to-sine and pulse-to-consine reference signal generating circuit;
D. A reference pulse conditioning circuit;
E. A digital sweep circuit for spectrum analysis;
F. Switching circuitry to accommodate all six functions;
G. Adjustment means to accommodate full-scale presentation of data on X–Y recorders.

The system also is adapted to accommodate multiple input sources, for example, electrical displacement signals, electrical velocity signals, electrical accelerometer signals, electrical acoustic signals.

5 Claims, 24 Drawing Figures

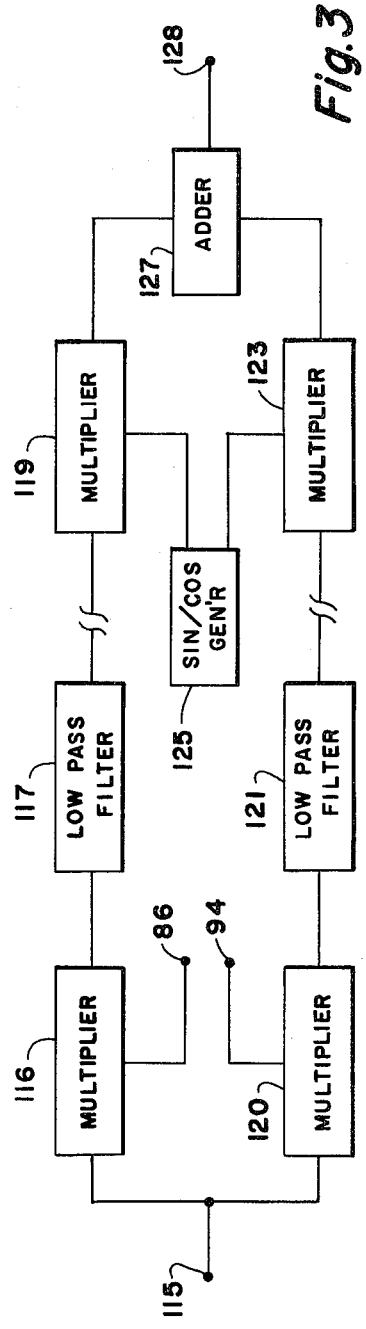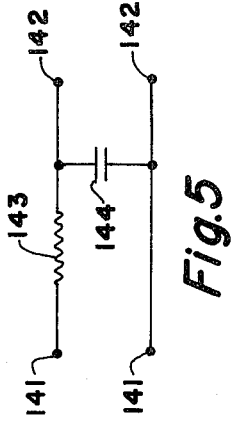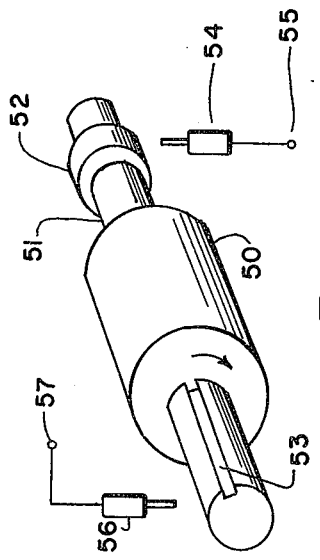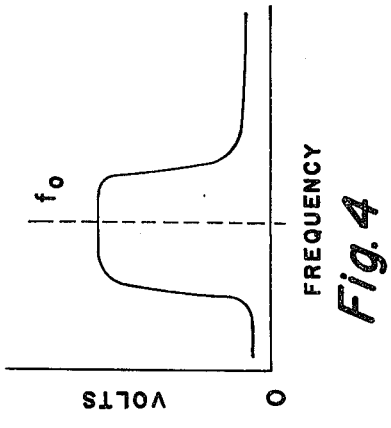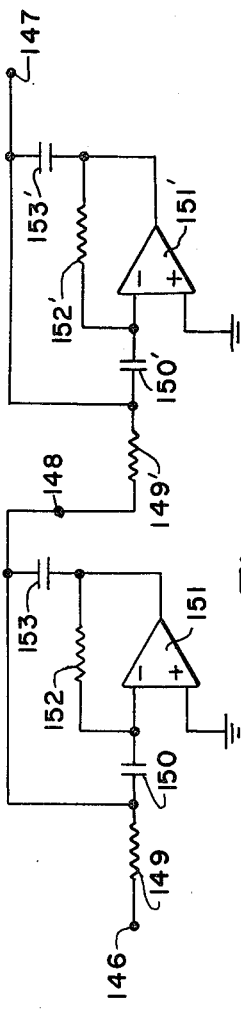

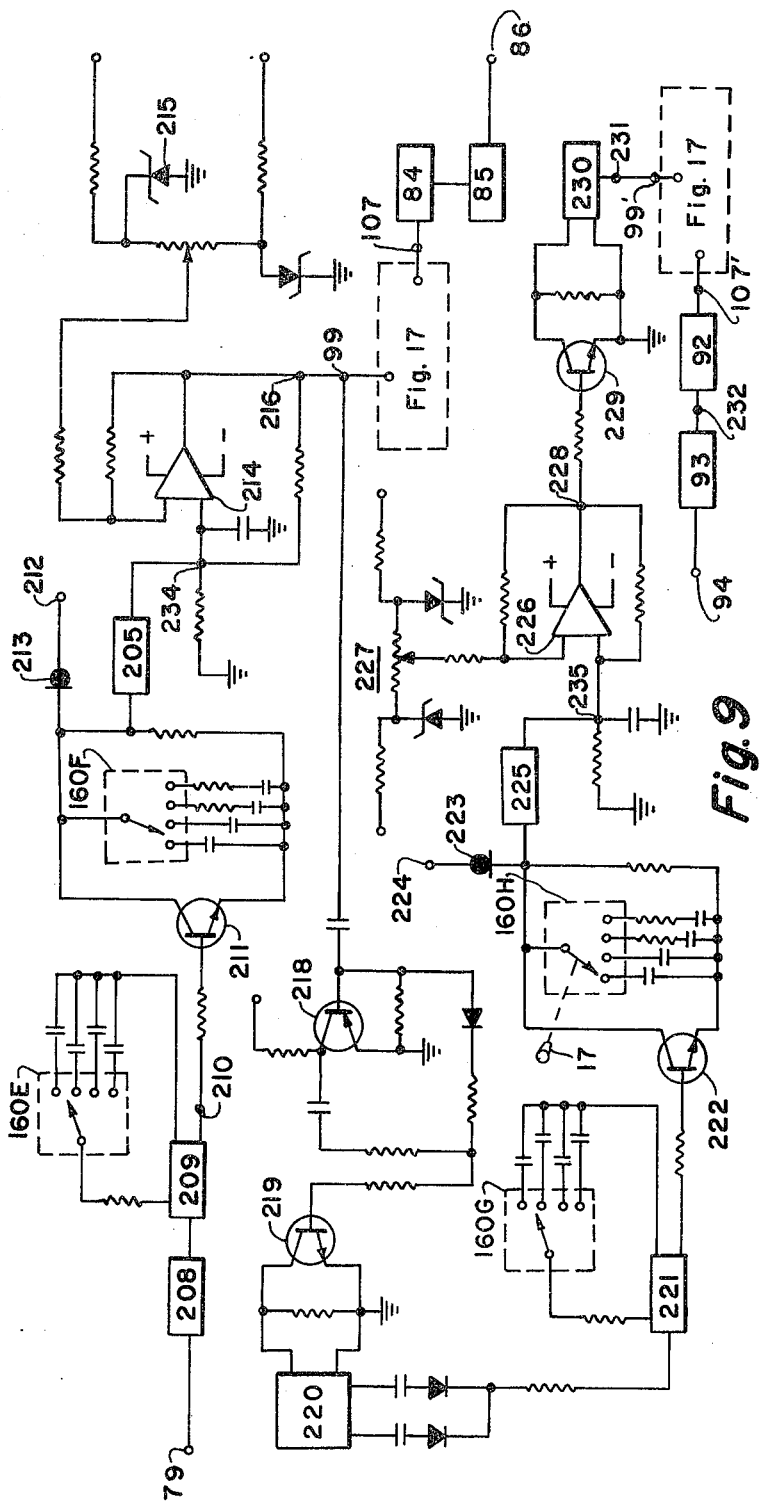
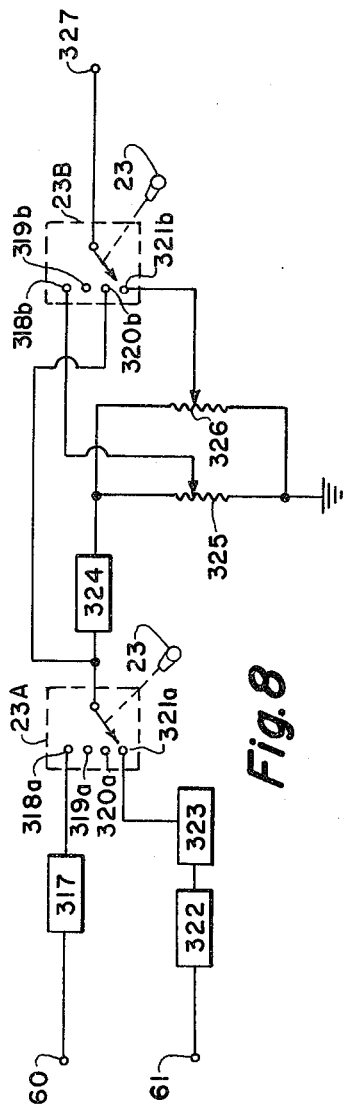
Fig. 9
Fig. 8

COMBINATION BALANCE ANALYZER AND VIBRATION SPECTRUM ANALYZER

BACKGROUND OF THE INVENTION

1. Field of the Invention

The invention relates to electronic circuitry for electro-mechanical balancing and for spectrum analysis of vibrations.

2. Description of the Prior Art

Rotating bodies exhibit mechanical vibrations as a result of mass unbalance, or mass eccentricity as it is sometimes called, worn bearings, bent shafts, misaligned shafts, et cetera. The manifestations of unbalance are cyclically repetitive. Numerous devices have been proposed for measuring the instantaneous displacement, velocity or acceleration of the rotating body and for converting such measured function into a corresponding cyclic electrical signal which can be analyzed.

a. Occasionally it is desired merely to locate the mass eccentricity and measure its amount in order to provide a worker with balancing information which can be used to add weights at specific locations or to remove weight from specific locations in order to compensate the mass eccentricity of the rotor. This type of analysis requires a number of factors, specifically an indication of the magnitude and an indication of the phase relation of the mass eccentricity with respect to a known mark on the rotor. This type of balancing also requires filtering of the mechanically derived signal to eliminate from those components of the signal other than the one-times-frequency components. Where the rotor is turning at a known rotational velocity, the filtering is fairly simple. However, with changing frequencies of rotation, a tracking filter is desirable to provide optimum filtration at the instantaneous rotational velocity.

b. A tracking filter enables the operator of a device to determine the amount of unbalance which a rotor manifests as it moves up in speed and as it moves down in speed. Frequently it is desirable to know if a rotor passes through a resonant frequency as it moves in its start-up state to its normal full speed. Also it is desirable to know whether resonant frequencies are encountered as the rotor is allowed to come to rest from full speed. In other instances, it is desirable to know the actual amount of unbalance manifestation through the start-up and shut-down speeds. A fixed frequency filter does not permit such calculations. A tracking filter will permit the operator to obtain such information.

c. Occasionally it is important to know the actual magnitude of unbalance or vibration at all frequencies as the rotor is altered in speed. For this purpose, the signal filter is eliminated and the total vibration manifestation is observed with the filter disabled or by-passed. This is known as a filter-out-speed characteristic.

d. Occasionally, it is desired to determine the instantaneous vibration manifestation of a rotor which is turning at a fixed speed and the amplitude of total vibrations for all frequencies is desired. In this mode, known as filter-out-frequency, the instantaneous vibration at each frequency can be observed.

e. The analysis of the entire spectrum of frequencies for vibration is known as spectrum analysis. To carry out a spectrum analysis, the rotor is turned at a fixed speed and a print-out of instantaneous vibration at each frequency is presented.

All of the foregoing functions are known in the prior art. One shortcoming of the prior art, however, has been the lack of a single machine to provide all of these functions in combination. One difficulty has been the lack of a suitable active filter, that is a filter with acceptable rejection characteristics, and acceptable time-delays. Customarily, the increasing sharpness of rejection characteristics is accompanied by an increasing time-delay. Passive filters for vibration analysis are known. See U.S. Pat. No. 3,307,408.

Digital sweep circuitry likewise is known which approximates linearity of frequency-sweep with respect to time.

Circuitry for generating reference sine waves and cosine waves in phase synchronism with cylic pulses is known. See U.S. Pat. No. 3,501,965. However, such prior art circuitry introduced small errors which would preclude their use in the present fast-response circuitry.

SUMMARY OF THE INVENTION

According to this invention, there is provided a combined balance analyzer, narrow band and wide band spectrum analyzer and automatic tracking filter which can be contained in a single housing. The circuitry operates in the following functions:

1. Testing function wherein the device provides visual checks for its own proper operation.

2. Balancing function wherein the vibration amplitude and phase angle of a rotor are measured with an extremely narrow band filter. The narrow band synchronous filter is automatically tuned to the indicated frequency by means of a pulse input signal which also serves as a reference signal to indicate phase relationships.

3. A tracking function is provided to permit recording of vibration amplitude and phase simultaneously by employing a synchronous filter with a larger band width.

4. A filter-out-speed mode of operation permits recording of vibration amplitude as a function of the rotating speed.

5. A filter-out-frequency mode of operation permits the measurement of the dominant frequency of vibration and its amplitude.

6. A spectrum analysis mode of operation provides an integral reference signal which sweeps from a low frequency to a high frequency over a selected frequency range and plots the amplitude of vibration over the same selected range. The frequency range can be selected from a minimum value to a maximum value starting at 120 cycles per minute up to 600,000 cycles per minute. The speed of the spectrum analysis is established to provide optimum resolution related to optimum sweep time.

A vibration signal conditioning circuit accommodates signal generators of the velocity input type and the accelerometer input type. For this purpose an active integrator is employed which may be by-passed where a velocity signal is desired from a velocity signal generator. The active integrator is employed when the accelerometer input signal is converted to a velocity input signal. The active integrator also is employed with the velocity input signal to convert it to a displacement input signal if that is desired.

An active filter of rapid response and sharp rejection characteristics employs two separate parallel channels for the input signal. Each of the channels includes, in series, a first multiplier stage, a low pulse active filter and a second multiplier stage. The signal in one channel is acted upon by a sine wave in each of the two multiplier stages. The signal in the other channel is acted upon by a corresponding cosine wave in each of the two multiplier stages. The output of the two channels is combined in an adder circuit to produce an output signal containing only those components having the desired frequency of the low-pass filter. Similar circuits have been described in the U.S. Pat. No. 3,501,965. The present invention employs an active filter which achieves the rejection characteristics of a four-pole filter yet retains the delay characteristics of a two-pole filter.

Each of the two sequential stages of the active filter employs an operational amplifier which inverts and amplifies the ripple components of an input signal yet allows the DC components of that signal to pass through the circuit unrestricted.

An improved pulse-to-sine wave and pulse-to-cosine wave generating circuit converts an input pulse to a sawtooth wave which in turn is converted to a square wave having the frequency of the input pulses and being in phase with the pulses. That is the square wave crosses the X-axis at each pulse. The square wave is thereafter differentiated and rectified to produce a series of pulses at twice the frequency of the original pulse. The twice frequency pulses are converted into a sawtooth wave which is in turn converted into a square wave having twice the frequency of the original input pulses. The twice-frequency square wave is converted to a half-frequency square wave corresponding to the cosine of the original input pulses. Error gate circuitry is included to avoid ambiguous signals. The wave conversions are accomplished by combining in sequence a first sawtooth generator, a first driven multivibrator, a first flip-flop differentiator and full-wave rectifier, a second sawtooth generator, a second driven multivibrator, a second flip-flop differentiator, an electronic switch, an integrator and a sine wave generator or synthesizer. An additional electronic switch is connected to the output of the first driven multi-vibrator through an integrator and a sine wave synthesizer to produce the other required reference signal.

A reference pulse conditioning circuit is provided to supply constant amplitude pulses and to eliminate noise and spurious triggers from the system. The input pulses are delivered through a network of steering diodes and constant current diodes to a comparator integrated circuit which generates a trigger pulse only when the input signal exceeds a threshold voltage which can be adjusted for the unit. Thus, the input pulse signal is derived in the form of a series of sharp uniform pulses.

A digital sweep circuit is provided for the spectrum analysis mode of operation. The digital sweep circuit employs a free running electronic clock which generates square waves at one of several selected frequencies. The generated square wave is converted into a chain of pulses which are counted in electronic counters and are applied as fixed incremental electrical charges on a capacitor. Thus, the capacitor is charged at a uniform rate and its voltage increases in uniform increments. The voltage across the capacitor is converted to a corresponding current which drives a signal generator producing a sawtooth wave of constant amplitude at a frequency corresponding to the instantaneous charge on the capacitor. Adjustment means are provided within the digital sweep circuit for setting the minimum and maximum values of the sweeping range.

Appropriate switching circuitry is provided throughout the instrument to enable multiple uses of many circuits in the selected modes of operation. Multiple deck switches and ganged switches are advantageously employed.

Appropriate adjustments for the X values and Y values of an XY recorder are built into the apparatus to enable the operator to use the device over the full scale of coordinate paper within an XY recorder.

BRIEF DESCRIPTION OF THE DRAWING(S)

FIG. 3 is a schematic illustration of the synchronous filter circuitry;

FIG. 4 is a typical response curve for an active filter;

FIG. 5 is a schematic illustration of a conventional one-pole filter;

FIG. 6 is a schematic illustration of the active filter within the synchronous filter;

FIG. 7 is a schematic illustration of a typical installation of this invention showing a typical rotor and typical signal pick-up devices;

FIG. 8 is a schematic illustration of a vibration signal conditioning circuit;

FIG. 9 is a schematic illustration of a pulse-to-sine wave and pulse-to-cosine wave generator;

DESCRIPTION OF THE PREFERRED EMBODIMENT(S)

Figure 1:
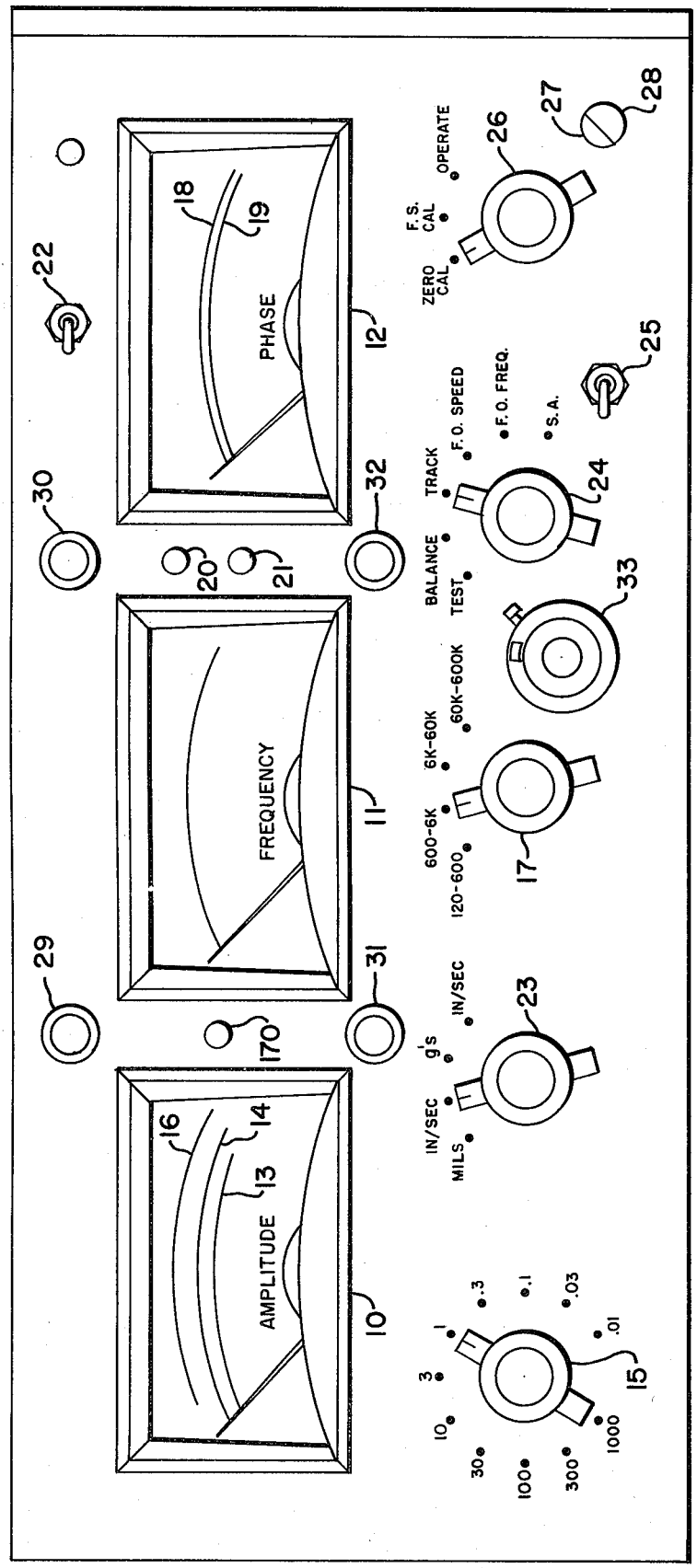
FIG. 1 is an illustration of the face of a housing for the present device presenting meters, adjustment knobs and indicating lamps.

A preferred embodiment of the invention is illustrated in FIG. 1 which is a reproduction of a face plate of a vibration spectrum analyzer instrument. By discussing the features illustrated on the face plate, the operation of the instrument will become clear and the explanation of the detailed circuitry will be simplified.

The instrument includes an amplitude meter 10, a frequency meter 11 and a phase meter 12. The amplitude meter has a number of scales including linear scales 13, 14 which are to be read in combination with the indications of an amplitude range multiplier knob 15. The numbers appearing in the detent positions of the amplitude range multiplier knob 15 correspond to the value of the full range deflection of the meter 10 on the scales 13, 14. An additional scale 16 also is provided for logarithmic indications of amplitude where this is desired.

The frequency meter 11 is provided with a single scale ranging in the example from 0 to about 600 units. This scale 17 is to be read in combination with the setting of a frequency range indicator knob 17. The indicator ranges correspond to the detent positions of the frequency range indicator knob.

The phase meter 12 is equipped with two scales, of which the scale 18 reads from 0° to 180° and the scale 19 reads in the opposite direction from 180° to 360°. To the left of the phase meter 12 appear indicating lights 20, 21. Preferably the indicating lights 20, 21 are provided in the same color (for example red and blue) as the legends on the corresponding phase meter scale 19, 18 respectively. The indicating lamps 20, 21 are intended to resolve the ambiguities which occur in providing the scale readings. Direct reading phase meters of the type comprehended are described more fully in copending application Ser. No. 217,165 filed Jan. 12, 1972 by Robert S. Morrow et al now U.S. Pat. No. 3,787,765 and assigned to the assignee of the present invention.

A conventional toggle switch 22 is provided for on-off functions of the device.

Because the instrument may be employed with a variety of input transducer devices such as seismic, non-contact, accelerometer, a pickup selector knob 23 is provided with a number of detent positions indicating a velocity pickup with a readout in "mils of shake" or in "shake as inches per second." Additional detent positions are provided for an accelerometer pickup with indications in inches per second velocity or in g's of acceleration.

A function switch is employed with a knob 24 to select the mode of operation for the device with a number of detent positions for the test position, the balance position, the tracking position, the filter out/speed position, the filter out/frequency position and the spectrum analysis position. An additional toggle switch 25 relates to the spectrum analysis mode and selects automatic operation or manual operation.

When the instrument is used in combination with an XY recorder, a recorder function knob 26 has three detent positions including a zero calibration position, a full scale calibration and an operate position. An indicator lamp 27 is provided to indicate the activation of the XY recorder. The indicator lamp 27 is contained in the button of a reset button 28 which returns the XY recorder to its zero position and also starts the recording function.

For spectrum analysis, a minimum frequency knob 29 and a maximum frequency knob 30 are provided to set the starting frequency and the ending frequency for a selected spectrum analysis. A manual tuning knob 31 is provided to tune the active filter to any particular frequency within the range already established by the position of the frequency range knob 17. A phase adjustment knob 32 provides a convenient indication of zero phase for reference purposes. The phase adjustment knob 32 is operative over the entire 360° range of the phase meter 12. The phase adjustment control knob 32 permits the relative phase meter reading be set at any convenient starting point. It is frequently convenient to use a major phase angle (0°, 90°, 180°, 270°) in preparing vector diagrams for balancing activities.

A reference adjust knob 33 provides a means for adjusting the reference signal level to accomplish the heat triggering when comparing the variances which exist in the putput levels of the different types of reference pickups, the noise or other inherent factors which might effect the periodic input signal, and problems or difficulties arising in selecting a suitable pickup trigger element.

INPUT AND OUTPUT CONNECTION

Preferably the input and output connections are provided on one or both side surfaces of the housing for the instrument illustrated in FIG. 1. One such side surface is shown in FIG. 1A and another side surface is shown in FIG. 1B.

Figure 1A:
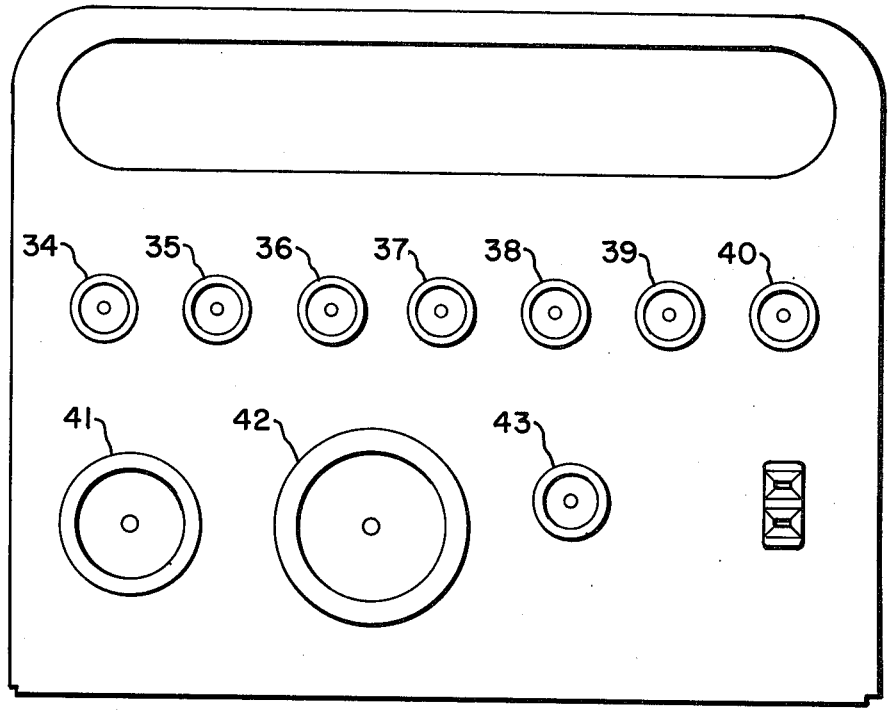
FIG. 1A is an illustration of one side of a housing for the present device presenting input and output jacks.
Figure 1B:
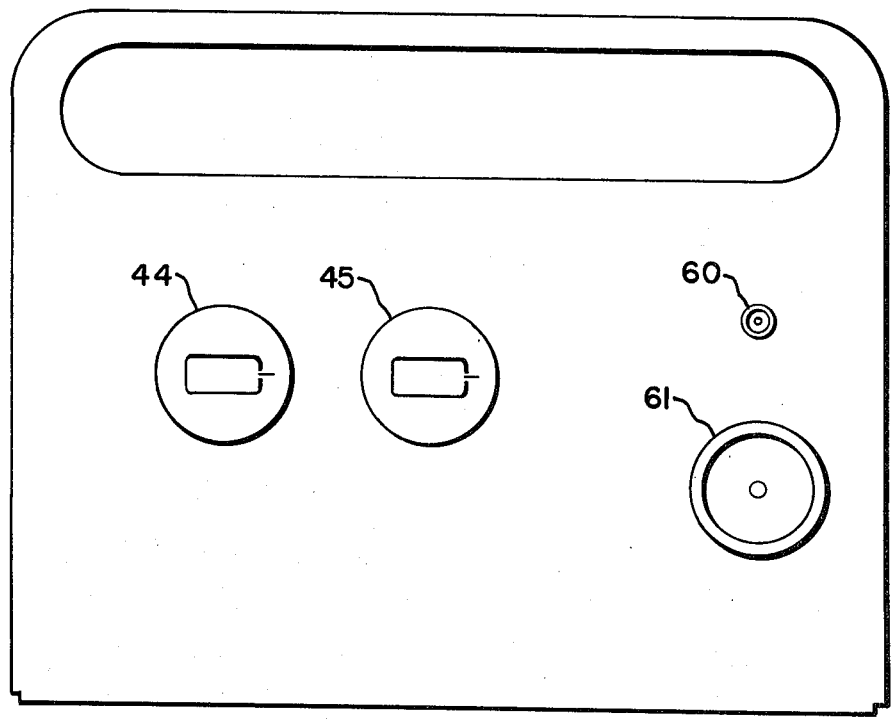
FIG. 1B is an illustration of another side of a housing for the present device presenting input and output jacks.

Typical signal input jacks in FIG. 1A include:

An oscilloscope input 34 which delivers an unfiltered vibration signal for visual observation to an oscilloscope.

A reference output jack 35 which provides a constant amplitude rms sinusoidal signal as a reference signal at the precise reference signal frequency. The reference signal is useful in the balancing and tracking modes of operation.

A frequency output jack 36 provides a constant amplitude square wave at the indicated frequency of a reference signal. The frequency output signal is useful where external digital frequency meters are employed in combination with the present apparatus.

An amplitude log jack 37 provides a DC voltage signal which is proportional to the logarithm of the input signal amplitude. This signal is useful in deriving a decibel printout where desired.

An amplitude linear jack 38 produces a DC voltage signal which is a linear function of the amplitude of the vibration signal. This amplitude linear jack signal is useful in deriving an overall vibration printout. The signal also corresponds to filtered signals.

A frequency receptacle 39 derives a direct current signal which is a linear function of the instantaneous frequency. This frequency jack signal is useful in driving the X-axis element of an XY recorder device.

A phase jack 40 provides a DC voltage which is a linear function of the instantaneous phase relation between the reference trigger signal and the zero crossing of the vibration signal. A zero degree phase reading on the phase meter 12 will correspond to a zero output at the phase jack 40. A full scale reading on the phase meter 12 will correspond to a maximum DC voltage signal output in the phase jack 40, customarily about 3.6 volts.

A reference signal input jack 41 is provided ro receive pulse signals for an electromagnetic or photoelectric reference pickup.

A power input jack 42 is provided to receive electrical power to operate the unit.

A pen-lift jack 43 is provided to accept a pen-lift cable from an XY recorder. A preferred embodiment of the apparatus includes internal circuitry for automatically lifting and activating a plotting pen.

As shown in FIG. 1B, several vibration pickup input jacks 60, 61 are provided to receive a plug from a vibration transducer. One vibration signal input jack 60 is adapted to receive a vibration signal from an accelerometer transducer. The other vibration signal input jack 61 is adapted to receive a seismic vibration input signal.

Sensitivity adjustment knobs 44, 45 are provided to adjust the precise sensitivity of the vibration input signal supplied to the input signal jacks 60, 61 respectively. The sensitivity adjustment knobs 44, 45 position a rheostat to provide the precise sensitivity required in accordance with the vibration transducer which has been selected to the activity.

Referring to FIG. 7, the overall environment of the present invention is broadly illustrated. In FIG. 7, a rotor 50 is mounted for rotation about a shaft 51 mounted in bearings 52 and having a keyway 53. One electromagnetic transducer 54 generates an oscillating electrical signal at a terminal 55 which corresponds to the instantaneous mechanical vibrations of the bearing 52, as shown in FIG. 7. The transducer 54 may be a seismic generator of the type shown in U.S. Pat. No. 3,157,852 which generates signal proportion of the instantaneous velocity of the bearing 52. The transducer 54 may be an accelerometer which generates an oscillatory signal corresponding to the instantaneous acceleration of the bearing 52. The transducer 54 may be a non-contact sensor of the type described in the U.S. Pat. No. 3,521,158 which generates a signal proportional to the instantaneous displacement of the bearing 52. Regardless of the particular type of electromagnetic transducer 54, a vibration corresponding signal is applied to a terminal 55 hereinafter referred to as a vibration signal.

A second signal generator 56 generates a pulse signal for each rotation of the rotor 50 and generates that pulse at the same angular location of the rotor 50 in each cycle. Typically, the transducer 56 is a non-contact transducer which is responsive to the presence of the keyway 53 in immediate proximity to the sensing tip of the transducer 56. Thus, with each rotation of the rotor 50 a pulse will be generated by the transducer 56 and applied to the reference terminal 57 at the instant when the keyway 53 is proximate to the transducer 56. Other transducers might employ photoelectric response to a bright spot or a dark spot which is applied to a single spot on the periphery of the rotor 50 or the shaft 51. The two signals at the terminal 55, 57 are the input signals for the present apparatus.

The overall apparatus can be described by reference to FIG. 2 wherein the vibration signal from the terminal 55 (FIG. 7) is applied to a vibration signal input terminal 60 or 61 depending upon whether the vibration input signal is a seismic signal, a displacement signal or an acceleration signal. Acceleration signals are applied to terminal 61. The vibration signals corresponding to velocity of displacement are applied to the terminal 60.

These terminals 60, 61 correspond to the input jacks 60, 61 respectively in FIG. 1B. A reference signal input from the terminal 57 (FIG. 7) is applied to a reference signal input terminal 62 in FIG. 2. The reference signal input terminal 62 corresponds to the input jack 41 of FIG. 1A.

Figure 2:
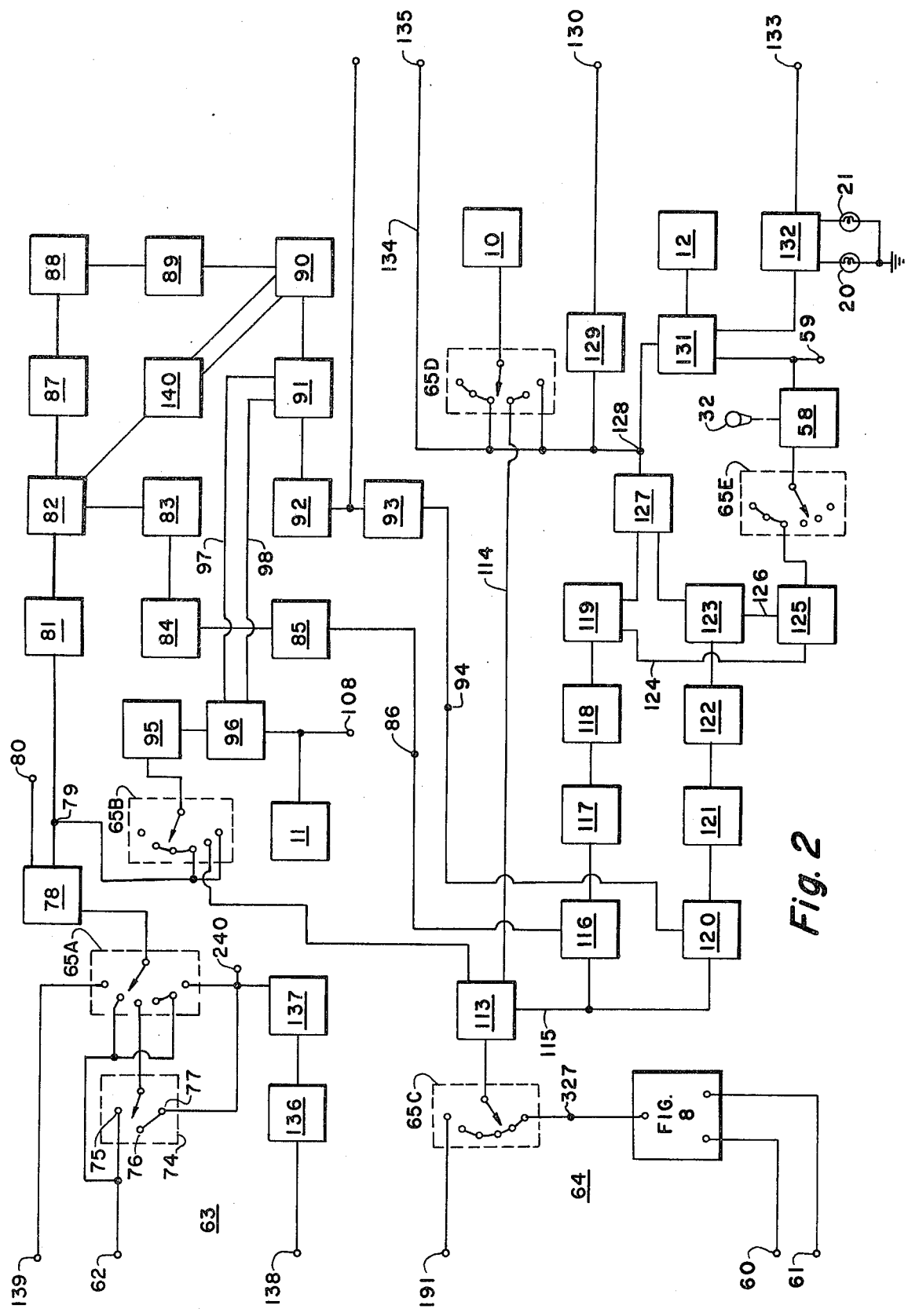
FIG. 2 is a schematic illustration of circuitry of the present device.

The reference signal at terminal 62 is acted upon through a channel 63 shown in the upper portion of FIG. 2. The vibration input signals of the input terminals 60, 61 are acted upon in a vibration signal channel 64 shown in the lower part of FIG. 2.

In the present apparatus, the pulse reference signal from the input terminal 62 is employed to generate two precise reference signals, one of which is a sine wave signal having the identical frequency of the pulses which are applied to the input terminal 62. The sine wave signal is precisely in phase with the pulses -- that is, each pulse occurrence coincides with a zero axis crossing of the generated sine wave. The second signal derived from the pulse input at terminal 62 is a cosine signal having the same characteristics as the derived sine wave signal of being displaced at precisely 90° from the sine wave signal. These two derived signals are generated in the reference signal channel 63 and are employed as multiplying waves in the vibration signal channel 64.

THE REFERENCE SIGNAL CHANNEL

The reference signal channel 63 will be described by reference to the wave forms shown in FIG. 12 which are presented in the various stages of the reference signal channel 63.

A number of switches are employed in the circuitry to show the relation of various components when the apparatus is employed for different modes of operation. One such multiple position which is identified by the numeral 65 corresponding to the function switch 24. The multiple position switch 65 is shown in FIG. 2 as 65A and 65B in the reference signal channel 63 and as 65C, 65D and 65E in the vibration signal channel 64. This multiple position switch 65 also appears in other figures. In each instance, the multiple position switch 65 has the features illustrated in FIG. 16 including a wiper arm 66 in contact with an output terminal 67 and six terminals 68, 69, 70, 71, 72, 73 which correspond respectively to the six positions of the function switch 24 of FIG. 1, namely, 68 - test position;
69 - balance position;
70 - track position;
71 - filter-out-speed position;
72 - filter-out-frequency position;
73 - spectrum analysis position.

All of the switches 65 are mechanically ganged in a multiple deck switch whereby the positioning of the function switch 24 (FIG. 1) locates the wiper arm 66 in engagement with the identical terminal of each of the decks of the switch 65.

A switch 74 in the reference signal channel 63 (FIG. 2) corresponds to the recorder switch 26 of FIG. 1 wherein the terminal 75 corresponds to the operate position; the terminal 76 corresponds to the full scale calibration position; and the terminal 77 corresponds to the zero calibration position. It will be observed that the terminal 76 and 77 are connected.

The input pulse at the reference input terminal 62 frequently has associated with it some noise and false trigger content which might reduce the precision required in the apparatus. To eliminate false triggers and sharpen the pulse reference input signal, an input circuit 78 is provided as will be hereinafter more fully described. The output from the input circuit 78 is a clean pulse wave as shown in wave form A of FIG. 12 applied at the terminal 79 and also applied at an output terminal 80. The pulse wave from terminal 79 is applied to a first sawtooth signal generator 81 which is a circuit which charges a capacitor starting at each pulse. The charging occurs through constant current diodes so that the charging rate of the capacitor is linear. Each pulse shorts the capacitor to ground through a transistor which is connected in parallel with the capacitor. Thus, the output signal from the first sawtooth generator 81 has the wave form B of FIG. 12. This signal is delivered into a driven multi-vibrator 82 which generates a square wave signal of constant amplitude having a positive excursion which corresponds to the negative excursion of the sawtooth wave B. This resulting square wave C, shows in FIG. 12, is delivered from the multi-vibrator 82 through an electronic switch 83 to an integrator 84 which produces a triangular wave D, FIG. 12. The triangular wave D has a frequency corresponding with the pulses of the input signal A. The triangular wave D is delivered to a sine wave shaper 85 to convert the wave D into simulated sine wave K, FIG. 12, at an output terminal 86.

In order to develop the corresponding cosine wave, the output of the driven multi-vibrator 82 (that is, the square wave C, FIG. 12) is delivered to a flip-flop circuit 87 which generates a single pulse each time the square wave C passes through a zero value. The resulting signal from the flip-flop circuit 87 is a chain of pulses as shown in the wave form E of FIG. 12 having positive pulses corresponding to the original pulses of wave form A and having negative pulses corresponding to the midpoint between the wave form A pulses. The pulses of wave form E are rectified to produce wave form F which is a series of pulses identical with the wave form A except having twice frequency. The pulse wave form F is applied to a second sawtooth generator 88 to produce a sawtooth wave form G as shown in FIG. 12 having a frequency which is twice the frequency of the corresponding sawtooth wave form B. The sawtooth wave G is delivered to a free-running multi-vibrator 89 which converts the sawtooth wave G to a square wave H of constant amplitude having positive excursions when the sawtooth wave G has a negative excursion. The square wave H is divided by two to produce a square wave I having the same frequency as the square wave C but being 90° displaced from the square wave C. Square wave I is delivered from the flip-flop multi-vibrator 90 to an electronic switch 91 and thence an integrator 92 which converts the square wave I to a triangular wave J. The triangular wave J is shaped in a sine wave shaper 93 to produce a sine wave at an output terminal 94. The sine wave at the terminal 94 and hence can be considered as a cosine wave.

The function of the electronic switches 83, 91 is to convert the square waves G and I respectively to a corresponding frequency square wave having an amplitude which is directly proportional to the frequency of the square wave. The subsequent integration of the square wave in the integrators 84, 92 respectively produces a triangular wave of constant amplitude inasmuch as integrators develop an output signal which is reciprocally related to the frequency. Thus the combination of an electronic switch and an integrator in series generates an output sine wave at constant amplitude from an input square wave of constant amplitude.

Figures 16, 17:
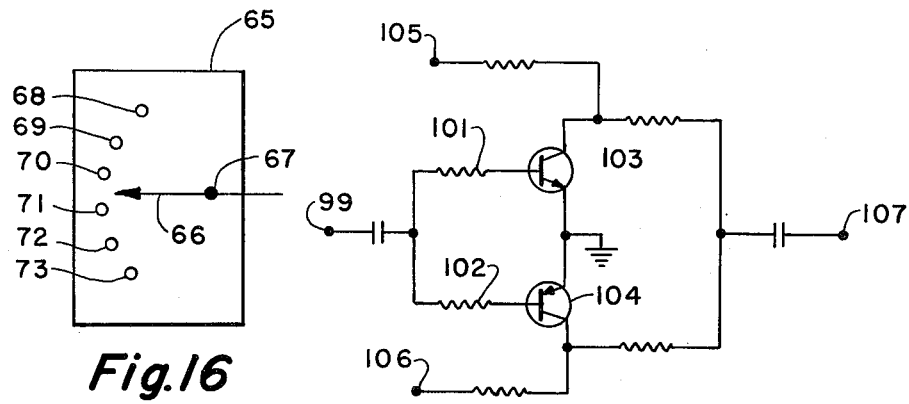
FIG. 16 is a schematic illustration of a typical deck of the multiple deck switch.
FIG. 17 is a schematic illustration of circuitry for providing a constant amplitude square wave signal regardless of the frequency of the input signal.

The electronic switches 83, 91 obtain a direct current signal which is directly proportional to the frequency of the incoming signal. The frequency related DC input for the electronic switches 83, 91 is generated in a frequency-to-DC converter 95 which delivers an output signal to a DC amplifier 96. The output signal from the DC amplifier 96 drives a frequency meter 11 which also appears in FIG. 1. The positive and negative values of the DC signal from the DC amplifier 96 are delivered through conductors 97, 98 to the electronic switches 83, 91 where the circuitry of FIG. 17 provides an output signal which is a square wave having an amplitude directly proportional to the frequency of the input signal. As shown more fully in FIG. 17, a constant amplitude square wave is applied as an input signal at the input terminal 99 through a coupling capacitor 100 and applied through resistors 101, 102 to the base of a NPN transistor 103 and a PNP transistor 104 respectively. The emitters of the transistors 103, 104 are joined to ground. The collectors are joined to a positive terminal 105 and to a negative terminal 106, respectively. A positive voltage is applied to the positive terminal 105 and a negative voltage is applied to the negative terminal 106 from the DC amplifier 96 (FIG. 2) wherein the voltage of the applied signal and terminals 105, 106 is directly proportional to the frequency of the reference signal at the wiper arm of the switch 65B. The input square wave makes one of the transistors 103 conducting during half of the square wave cycle and makes the other transistor 104 conducting during the other half of the square wave cycle. Thus, the output signal from the circuit in FIG. 17 applied to the output terminal 107 is a square wave having an amplitude directly related to the instantaneous frequency of the reference signal. When that signal from the output terminal is subsequently integrated, the output from the resulting integrator is a constant amplitude regardless of frequency. That is, the triangular wave resulting from the integrator has a constant peak-to-peak amplitude. When subsequently subjected to wave shaping circuitry in the sine wave shapers 85, 93, a uniform sine and cosine wave is obtained, i.e., a constant peak-to-peak amplitude.

The frequency-to-DC signal also is delivered to an output terminal 108 which corresponds to the frequency reference jack 39 of FIG. 1A.

The vibration signal channel 64 receives an unfiltered AC signal related to the instantaneous vibration of the object under investigation. The signal is applied to input terminals 60, 61 and is conditioned as required to provide an appropriate signal in a signal conditioner as more fully illustrated in FIG. 8. The signal conditioner includes an integrator to integrate an accelerometer signal to produce a velocity response signal, if that is required, or to integrate a velocity signal to produce a displacement responsive signal, if that is required. Appropriate switching permits activation or by-passing of the integrator. The resulting unfiltered AC signal is delivered to a preamplifier 113. That signal is delivered directly through switch deck 65C to the preamplifier through a conductor 114 and switch deck 65D to am amplitude meter 10 corresponding to the amplitude meter of FIG. 1. The direct vibration signal is employed in the filter-out-speed and filter-out-frequency mode as will be apparent from the switch decks 65C and 65D.

The unfiltered AC signal also is delivered from the preamplifier 113 through a conductor 115 to each input terminal of a pair of filter channels which include a first multiplier 116, an active filter 117, a DC amplifier 118 and a second multiplier 119 constituting a first channel; and a first multiplier 120, an active filter 121, a DC amplifier 122 and a second multiplier 123 constituting a second channel. The sine wave signals previously generated from the sine wave terminal 86 is applied to the first multiplier 116 in the first channel. The cosine signal from the cosine signal terminal 94 is applied to the first multiplier 120 and the second channel. The input oscillatory vibration signal obtained from the preamplifier 113 through the conductor 115 can be represented by the symbol sine $(wt+\theta)$. Because the sine and cosine signals from the terminals 86, 94 respectively are presented at the same frequency $wt$, the multiplication product of the two signals from the multiplier 116 can be represented as:

$$\text{cosine } \frac{\theta}{2} - \text{cosine } \frac{2wt+\theta}{2}.$$

when that signal is delivered through an active low-pass filter 117, the twice frequency term $$\text{cosine } \frac{2wt+\theta}{2}$$

drops out and the output from the low-pass active filter is a signal having the value $$\text{cosine } \frac{\theta}{2},$$

that is, a DC signal. This DC signal is amplified in a DC amplifier 118 and delivered to the second multiplier 119 where it is multiplied by a second sine wave delivered through a conductor 124 from a sine/cosine generator 125. The frequency of the sine wave in the conductor 124 need not be the same as the reference frequency. Although in the case where the sine wave signal in the conductor 124 is the same as the reference frequency, then H product signals from the multiplier 119 is the function $$\text{sine } \frac{wt+\theta}{4} + \text{sine } \frac{wt-\theta}{4}.$$

In the second channel the input signal sine $(wt+\theta)$ is multiplied by the cosine signal from the cosine signal terminal 94. The output of the first multiplier 120 thus is the function $$\text{sine } \frac{\theta}{2} + \text{sine } \frac{2wt+\theta}{2}.$$

039383940232x n
When that signal is delivered through the low-pass active filter 121, the twice frequency signal drops out and the resulting signal corresponds to a direct current having the value sine $\theta/2$. That signal is amplified in the DC amplifier 122 and delivered to the second multiplier 123 therein a cosine signal from the sine cosine generator 125 is applied through a conductor 126. The output of the second multiplier 123 thus has the value $$\text{sine } \frac{wt+\theta}{4} - \text{sine } \frac{wt-\theta}{4}.$$

The outputs of the two multipliers 119, 123 are combined in an adder circuit 127 to produce an output signal having the value $$\text{sine } \frac{wt+\theta}{2}.$$

This signal differs from the input signal of conductor 115 in that all of the interference signals have been eliminated and the amplitude of the selected frequency $wt$ at the low-pass active filters 117, 121 is half of the amplitude of the corresponding frequency signal from the input conductor 115.

In the alternative situation where the sine/cosine generator 125 provides a high frequency carrier signal, the output from the adder at the output terminal 128 is a modulated signal having a carrier frequency corresponding to the frequency of the sine/cosine generator 125 and having a fundamental frequency $wt$. A useful modulating frequency for the sine/cosine generator 125 is about one kilohertz.

The output signal from the terminal 128, after rectification, can be applied directly to the log amplifier 129 which drives the indicator of the amplitude meter 10 (FIG. 1) according to the scale 16. The same signal can be delivered to an output terminal 130 which corresponds to the amplitude log output jack 37 of FIG. 1A. The signal also is delivered from the terminal 128 through the switch deck 65D to the amplitude meter 10 when the function selector knob 24 (FIG. 1) has the switch 65 in the test position, balance position, track position, or spectrum analysis position. The signal further is delivered from the output terminal 128 to a phase meter circuit 131 which in turn drives the phase meter 12 and the phase meter indicating lights circuit 132 which ignites the lamps 20 or 21 (FIG. 1) and also provides an output signal at a terminal 133 which can be used with a phase recorder jack 40 (FIG. 1A). The oscillating signal applied to the terminal 128 is also delivered to a conductor 134 to an amplitude output terminal 135 corresponding to the linear amplitude recorder jack 38 (FIG. 1).

Figure 21:
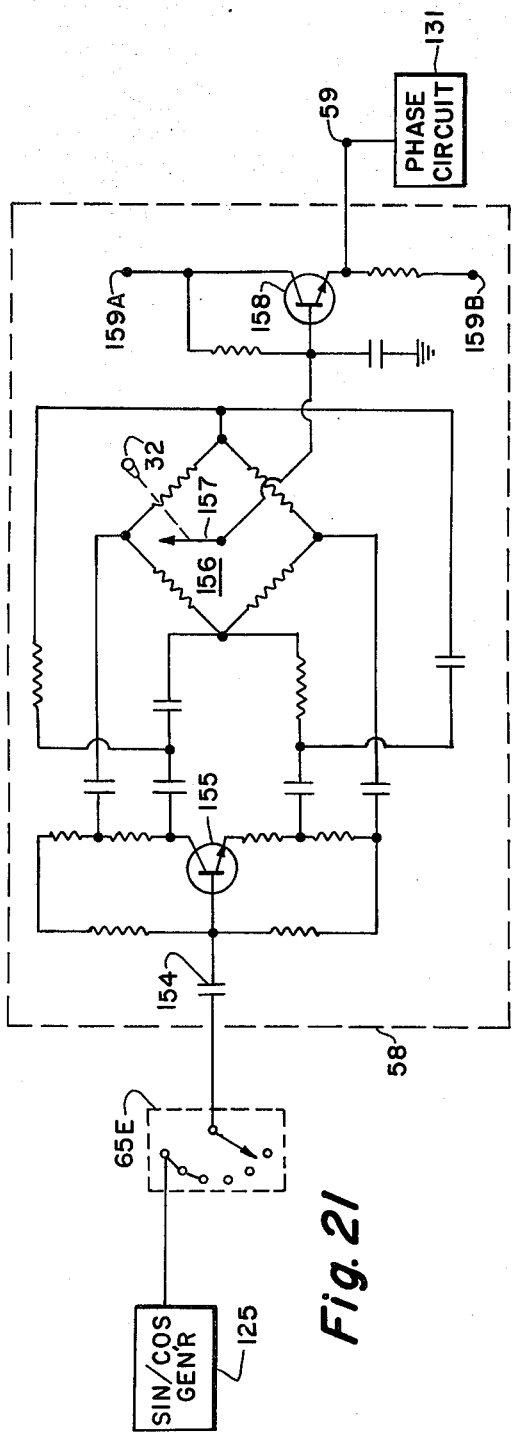
FIG. 21 is a schematic illustration of a phase adjustment circuit employed in the system.

The sine/cosine generator 125 delivers a signal through the switch deck 65E to a phase adjust circuit 58 (more fully illustrated in FIG. 21). The phase alignment of the signal applied from the sine/cosine generator 125 to the phase adjust circuit 58 is arbitrary and hence phase adjustment capability is required. Phase adjustment is achieved by turning the phase adjust knob 32 which appears in FIG. 1 and also appears schematically in FIGS. 2 and 21. The output signal from the phase adjust circuit 58 is merely the sine wave signal from the sine/cosine generator 125 shifted in phase over a range of 0° through 360°. That phase shifted signal, applied to a terminal 59, becomes a reference signal in the phase circuit 131 where it is compared with the signal from the output terminal 128. The phase adjust knob 32 permits the operator to check the preformance of the phase meter circuitry in the test mode and also provides a phase reading when the system is operating in the balancing and tracking modes. It should be noted that the phase meter is disabled during the "filter-out-frequency" mode, the "filter-out-speed" mode and the "spectrum-analysis" mode.

THE SPECTRUM ANALYSIS MODE OF OPERATION

Continuing to refer to FIG. 2, it is apparent that when the present apparatus is operating in its spectrum analysis mode, the reference signal is not required from the reference signal input terminal 62. Instead a frequency-sweeping signal is employed. The frequency-sweeping signal is generated in a digital sweep circuit identified by the numeral 136 which generates a driving frequency signal having a frequency which increases at linear rates whereby the reference signal (for the spectrum analysis mode) is unrelated to the instantaneous velocity of the object under examination, but instead, is a uniformly increasing frequency set up by the digital sweep circuit 136. The sweeping signal is delivered through a spectrum analysis circuit, identified by the named 137, and delivered to the terminals 76, 77 of the switch 74 and also to the spectrum analysis mode terminal of the mode switch deck 65a. In the spectrum analysis mode, accordingly, the digital sweep signal is delivered into the input circuit 78 and through the sine and cosine generating circuitry of the reference channel 63 to produce sine and cosine signals at terminals 86, 94 which have the same instantaneous frequency and have a frequency which is increasing linearly as the spectrum analysis develops.

Also connected to the digital sweep circuit 136 is a pen lift output terminal 138 corresponding to the output jack 43 of FIG. 1A. The pen lift terminal 138 provides a signal to start and stop the active recording of information in a manner hereinafter to be more fully described.

A further input terminal 139 provides a reference input electrical signal which is derived from power line voltage to the test terminal of the mode selector switch deck 65A. This test signal would normally be provided at a frequency of 60 cycles per second and can be employed to check the accuracy and calibration of the frequency meters.

Also included within the reference channel 63 is an error gate circuit 140 which compares the output of the flip-flop amplifier 90 and the output of the multi-vibrator 82 to prevent ambiguities in the resulting sine and cosine signals at the terminals 86, 94. The error gate circuit 140 employs logic elements to assure the proper presentation of the sine and cosine signals at the terminals 86, 94.

The present invention is feasible because of the use of an active filter in the vibration signal channels, as elements 117, 121. In the past filtration has been accomplished as a compromise between sharpness of the rejection characteristics and the required speed of adjustment. In general the filters available in the prior art require about a one-second delay for each "pole" of resolution. A "pole" of resolution corresponds to a rejection of about six decibels per octave. Thus a two-pole resolution would require approximately two seconds time delay. A four-pole resolution would require about four seconds time delay. The prior art did not provide any filtering circuitry adequate to accomplish the sharpness of rejection in the time available for the rapid sweeping which can be achieved with a rapid digital sweep circuit.

Referring to FIG. 5, there is illustrated a typical schematic illustration of a one-pole filter of the prior art. The filter of FIG. 5 includes input terminals 141 and output terminals 142. A resistor 143 joins one input terminal with output terminal. A capacitor 144 is connected across the outside terminals 142. This so-called one-pole filter will achieve a rejection characteristic of about six decibels per octave. When two of these filters of FIG. 5 are assembled in series, that is the input terminals 141 of one such filter connected to the output terminals 142 of another such filter, the resulting rejection characteristic is about twelve decibels per octave, although the response time doubles.

The synchronous filter of the present invention develops the equivalent of a four-pole filter from the standpoint of rejection characteristics, yet retains the response time of a two-pole filter. The circuitry is more fully illustrated in FIG. 6 wherein the active filter has an input terminal 146 and an output terminal 147. The filter has two stages with the output terminal 148 of the first stage corresponding to the input terminal of the second stage. The two stages are identical. Each stage includes a resistor 149, a DC blocking capacitor 150 connected to an operational amplifier 151. The output of the operational amplifier 151 is fed back to the input through a resistor 152. The output of the operational amplifier is delivered to a coupling capacitor 153 to the output terminal 148 (147). In effect the direct current components of the signal applied to the terminal 146 are delivered directly through the circuitry to the output terminal 147. The ripple voltage at the terminal 146 is inverted and amplified in the operational amplifier 153 to produce a sharp resolution. The rejection characteristics of the resulting active filter can be illustrated in FIG. 4 which shows a steep-sided response curve on each side of the tuned frequency $f_o$. This extremely sharp response is referred to as a Butterworth response. The sharp projection permits the device to discriminate desired electrical signals despite the presence of significant interference signals at frequencies which are close to the desired frequency.

Figure 10:
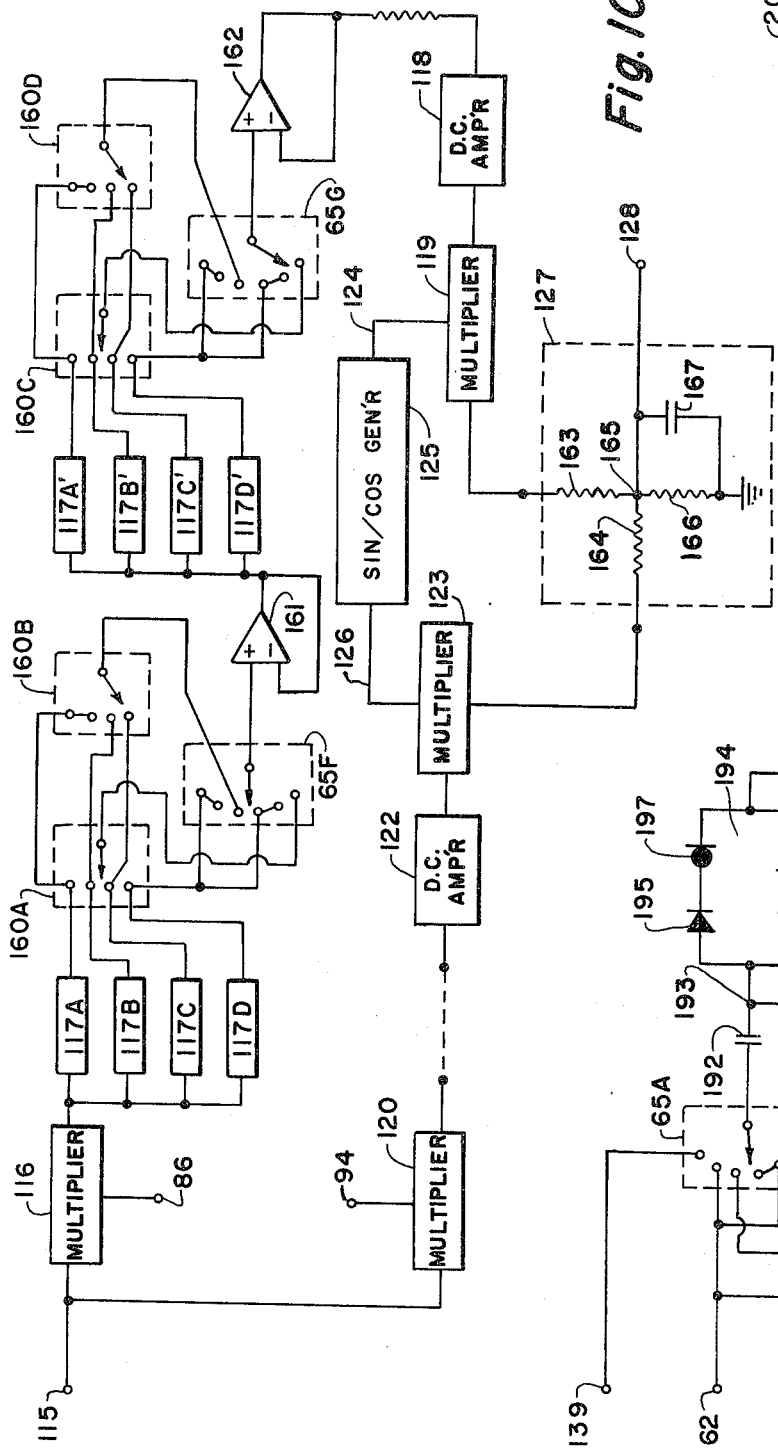
FIG. 10 is a schematic illustration of the synchronous filter of FIG. 3 in somewhat greater detail.

It will be observed from FIG. 10 that the active filter circuitry includes multiple pairs of individual active filters, 117A and 117A'; 117B and 117B'; 117C and 117C'; and 117D and 117D'. Each pair of active filters has a different rejection characteristic. It will be observed from FIG. 10 which is a somewhat more detailed view of the circuitry otherwise appearing in FIG. 3, that the multiple decks 160 correspond to the frequency range selector knob 17 (FIG. 1). The decks 160 provide switching arrangement to activate the operation of the active filter. Each deck 160 includes four input terminals corresponding to one of the available frequency ranges for the synchronous filter. Each deck 160 also includes a wiper arm and an output terminal. In FIG. 10 the indicated decks are identified as 160A, 160B, 160D. There is also shown in FIG. 10 switch decks 65F and 65G of the mode selector switch 24 (FIG. 1). The input signal is supplied through a conductor 115 to the two channels of the active filter in FIG. 10. It will be understood that the bottom channel corresponds identically with the upper channel. It is essential to achieve identity of component characteristics in the two channels of this active filter.

The input vibrational signal is applied to a multiplier 116 which also receives a sine wave input from a terminal 86. The output from the multiplier 116 is delivered to a selected one of four available active filters 117A, 117B, 117C, 117D. Each active filter corresponds to the circuitry of FIG. 3. The active filters have a relatively low frequency range 117A and a relatively high frequency range 117D with two intermediate frequency ranges 117B, 117C. When the wiper arms of switch 160 are in the topmost position, the low frequency filter 117A is connected directly to the upper terminal of deck 160A and to the first and second terminals of deck 160B. The first intermediate frequency filter 117B is connected to the second terminal of deck 160A and to the third terminal of deck 160B. The second intermediate frequency filter 117C is connected to the third terminal of deck 160A and the bottom terminal of deck 160B. The high frequency filter 117D is connected to the bottom terminal of the deck 160A and to the test, balance, filter-out-speed and filter-out-frequency terminals at the deck 65F. The spectrum analysis terminal of deck 65F is connected to the wiper arm of the deck 160A and hence can receive signals through any one of filters 117. The tracking mode terminal of the deck 65F is connected to the wiper arm of the deck 160B where it receives filtered signals from the low frequency and two intermediate frequency filters 117A, 117B, 117C. The resulting filtered signal is delivered from the wiper arm of the deck 65F to a voltage follower 161 which has a high input impedance and a low output impedance. The first stage filtered signal is then delivered to the second stage filter 117A', 117B', 117C', 117D'. The switching connections from the active filters 117A'. 117B', 117C', 117D' through the switch decks 160C, 160D, and 65G are similar to those described in connection with the first stage. The signals then are delivered through another voltage follower 162 to a DC amplifier 118 and thence to a multiplier 119 and to an adder circuit 127. A sine wave generator 125 delivers a sine wave signal through a conductor 124 to the multiplier 119.

Similar circuitry for the bottom channel develops an output signal at the multiplier 123. A cosine generator 125 delivers a cosine wave signal through a conductor 126 to the multiplier 123. The output signals from the multipliers 119, 123 are delivered through resistors 163, 164 respectively to a mixing terminal 165 that is connected to ground through a shunt resistor 166 and a shunt capacitor 167.

The summation signal at the output terminal 128 corresponds to those components of the input signal (terminals 115) which are at the instantaneous frequency wt. This frequency is indicated at $f_0$ in FIG. 4. The actual rejection of the present active filter is about 24 decibels per octave.

For normal balancing operations the system employs a single filter in the low frequency ranges, up to 10 cycles per minuts (1/6 Hertz). For spectrum analysis, four filter ranges are employed:

1. 10 cycles per minute (1/6 Hertz)
2. 50 cycles per minute (5/6 Hertz)
3. 240 cycles per minute (4 Hertz)
4. 720 cycles per minute (12 Hertz)

For the tracking mode, three of the filters are normally employed:

1. 50 cycles per minute (5/6 Hertz)
2. 240 cycles per minute (4 Hertz).
3. 720 cycles per minute (12 Hertz).

The filter-out modes of operation are, as the term completely suggests, carried out with the filter disconnected. In the filter-out-speed mode, the frequency meter indicates the synchronous speed on a 1/1 basis. In the filter-out-frequency mode, the frequency meter indicates the dominant frequency component of the input singal. The amplitude meter indicates the same reading in both filter-out-speed and filter-out-frequency modes. Referring to FIG. 2, it will be apparent that the input signal from the per-amplifier 113 is fed directly through a conductor 114 to the two filter-out mode terminals of the switch deck 65D, thereby bypassing the filter circuitry.

FILTER OVERLOAD SIGNAL

Figure 22:
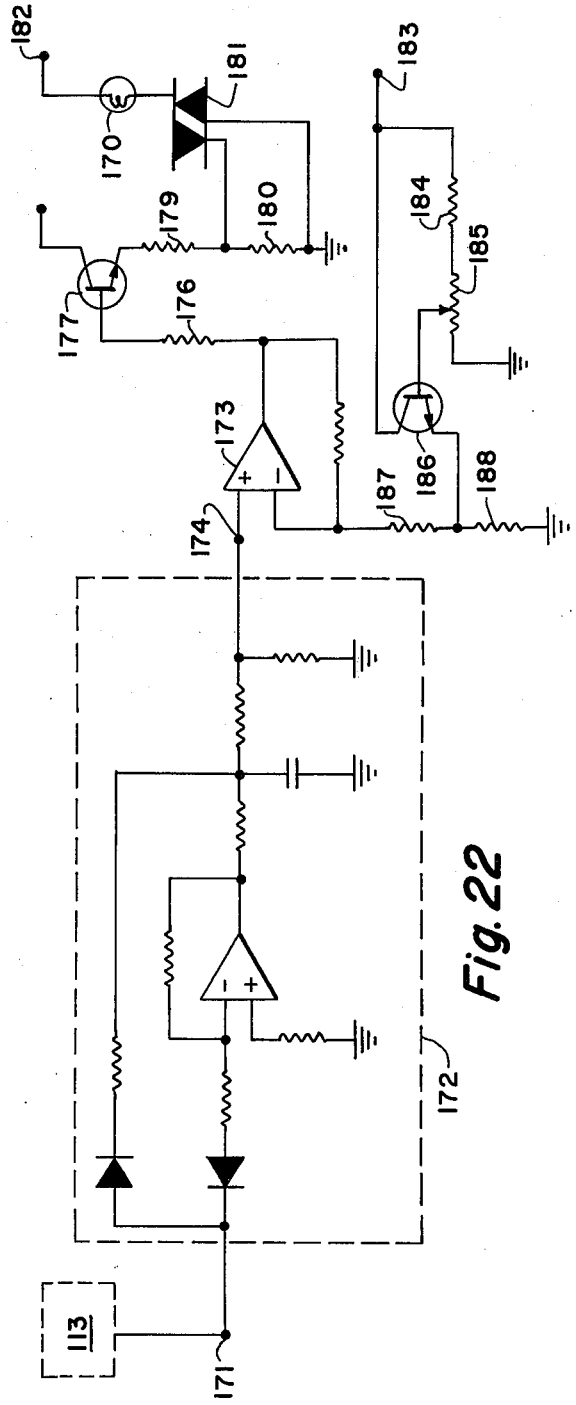
FIG. 22 is a schematic illustration of a filter overload circuit.

Another feature of the present invention is a filter overload signal which appears as a lamp 170 on the face of the meter (FIG. 1). The lamp 170 illuminates when the input signal feeding the filter circuit exceeds the level at which the filter functions efficiently. Circuitry for sensing filter overload is shown in FIG. 22. The overload is a compromise between peak overload voltage and average overload voltage. If the overload voltage were established solely on the basis of the average signal, the system is sluggish. It is possible, for example, to have a low duty cycle signal overloading the filter. On the other hand, if peak response were established as the basis for determining overload voltage, then the overload voltage indications may occur with noise peaks which really do not interfere with the accuracy of the filter performance. According to the present invention a compromise between average voltage and peak voltage is adopted to indicate filter overloads. Specifically the output signal from the preamplifier 113 (FIG. 2) is applied (FIG. 22) to an input terminal 171 which supplies a detector 172 which produces an output signal at a terminal 174 which is applied as an input signal for a voltage comparator 173. The detector 172 is an active detector which converts the alternating current signal at the input terminal 171 to a DC signal at the terminal 174. The other input terminal of the comparator 173 is maintained at a pre-established voltage. Normally the output from the comparator 173 at the output terminal 175 is connected through a resistor 176 to the base of an NPN transistor 177. So long as the signal at the terminal 175 is zero or negative, the NPN transistor 177 remains non-conducting. If the output signal at the terminal 175 becomes positive, the NPN transistor 177 becomes conducting and allows current to flow from a positive voltage input terminal 178 through the NPN transistor 177 and through two resistors 179, 180 to ground. When current is flowing through the resistors 179, 180, a positive voltage is applied to a Triac 181 (that is, a silicon-controlled rectifier for alternating current). The Triac 181 is connected in series with the loop 170 between a voltage terminal 182 for six volt alternating current supply and ground. When the Triac 181 becomes conducting, a current flows from the terminal 182 through the bulb 170 and Triac 181 to ground thereby illuminating the bulb 170.

The voltage comparator 173 is provided with a reference voltage input which has a low impedance and is temperature compensated. Specifically a voltage is developed at a voltage input terminal 183 across a resistor 184 and a potentiometer 185. The potentiometer tap is connected to the base of an NPN transistor 186. The collector is connected to the voltage input terminal 183. The emitter is connected between a pair of resistors 187, 188. The voltage applied as a reference voltage to the comparator 173 can be regulated by the potentiometer 185. The input voltage is provided at a low impedance. Because of the inverse temperature resistance characteristics of the components, the output of the comparator 175 is temperature compensated over an operating range of normal operation.

TEST MODE

In the test mode of operation, a test signal is applied to the terminal 139 (FIG. 2) and thence to the upper contact of the switch deck 65A. The test signal normally is line voltage available at 60 cycles per second. In the test position the unit develops corresponding sine and cosine waves at the terminals 94, 86 respectively and develops a frequency signal at the terminal 108 which can be employed to calibrate the frequency meter 11. Another test input signal is applied to terminal 191 from a line voltage source at 60 cycles per second. This signal is also applied to the test terminal of the switch deck 65C. This signal is delivered through the preamplifier 113 in the test mode and through the active filter to the output terminal 128 and thence through the switch deck 65D to the amplitude meter 10. The performance of the active filter and amplifying circuitry can be tested in this test mode.

It is also possible to test the performance of the phase meter 12 by determining a phase difference between the input signals at the terminals 139, 191. Phase adjust circuitry 58 of FIG. 2, employed for testing the phase meter performance, is more fully illustrated in FIG. 21.

PHASE ADJUST CIRCUIT

The sine wave signal from the sine/cosine generator 125 is delivered through the switch deck 65E in the test, balance and track modes to the phase adjust circuitry 58. The signal is delivered through a capacitor 154 to the base of a transistor 155. The signal is divided across the arms of a resistance bridge 156 having a wiper arm 157. The wiper arm 157 is operated by the phase adjust knob 32. The output from the wiper arm 157 is delivered to the base of the transistor 158 having its collector connected to a positive source 159A and having its emitter connected to a negative source 159B. The output signal from the transistor 158 is applied to the output terminal 59.

The output signal at the terminal 59 is identical with the input signal from the switch deck 65E except for the phase shifting which occurs in circuitry 58. Normally the signal from the switch deck 65E will be at 1,000 kilohertz.

A feature of the present system is that the only phase adjustment within the control of the operator is applied to a signal which is generated from an internal oscillator and is independent of the rotating body which is under observation. It will be observed that the reference signal from the reference generator terminal 62 (FIG. 2) is employed in the present system solely to generate sine and cosine signals at the terminals 86, 94. The vibration signals from the input terminals 60, 61 are employed in this circuitry solely to generate an amplitude signal at the output terminal 128. That output signal is modulated by an arbitrary sine or cosine signal generated in the sine/cosine generator 125 so that the signal appearing at the output terminal 128 is provided at the preferred 1,000 kilohertz frequency. Inasmuch as the same sine/cosine generator 125 is employed for the phase comparison circuitry, the actual signals from terminals 59, 128 are developed at the identical frequency.

It will be observed, for example, in the test mode (FIG. 2) that a 60 cycle test signal is applied from the terminal 139 to the switch deck 65A and also applied from the terminal 191 to the switch deck 65C. The two signals normally will be in phase with one another so that a zero reading can be expected at phase meter 12. In the test mode, the phase adjust knob 32 is rotated to provide visual indication that the phase meter circuitry is operative. Because the position of the phase adjustment knob 32 is totally arbitrary in the present system, the reading of the phase meter 12 has no physical significance in the test mode.

In the balance mode, the phase adjust knob 32 normally will be turned until a zero reading is provided on the phase meter 12. By adopting this technique, the balance indication on the phase meter 12 can be measured directly from the reference signal activator such as key way 53 (FIG. 7).

THE BALANCE MODE

In the balance mode of operation, a reference signal is applied through the input terminal 62 and thence through the switch deck 65A to a reference signal input circuit 78 and thence through the deck 65B to the frequency-to-DC generator 95 thence through the DC amplifier 96 to the frequency meter 11. The signal also is delivered from the terminal 79 through the sine and cosine generating circuitry to produce a corresponding sine wave at terminal 86 and a corresponding cosine wave at terminal 94. In the balance mode the input signals from the vibration transducers are delivered through terminal 60 or 61 and thence to the balance terminal of the switch deck 65C. Thence the signal is delivered through the preamplifier 113 and through the active filter to the filter output terminal 128 and thence to the switch deck 65D to the amplitude meter 10. The same signal (from terminal 128) also may be applied to the log amplifier 129. The same signal (from terminal 128) is applied to the phase meter circuit 131 to provide an indication of the phase relation between the reference signal from terminal 62 and the input signal from the deck 65C. In the balance mode the apparatus provides a direct indication of the amplitude of the signal at the same frequency as the rotational velocity of the article. The system also provides a phase indication of the phase angle between the reference signal and the fundamental vibration signal. The system further provides an indication of the instantaneous frequency.

TRACKING MODE

In the tracking mode, the reference input signal may be either the signal from the terminal 62 or a digital sweep signal applied through the terminals 76, 77 of switch 74. In all other respects the tracking mode is similar to the balance mode; that is, the amplitude, frequency and phase meter readings are presented. However wider band width filters are employed in the tracking mode and as a result relatively fast speed changes do not affect the accuracy of the system. The tracking mode allows the operator to observe the meters as a machine is accelerating or decelerating for example. The output frequency, phase and amplitude may be plotted on an X–Y recorder having an X axis moving linearly with time and having the Y axis dependent upon the magnitude of the phase, frequency or amplitude indications. In the tracking mode, the switch knob 26 will be maintained in the operate position (contact 75 of switch 74) whereby the reference signal from the terminal 62 will be fed directly through the switch 74 to the tracking terminal of the switch deck

65A.

FILTER-OUT-SPEED MODE

In the filter-out-speed mode, the reference signal input from the terminal 62 is delivered through switch deck 65A and produces a sine and cosine signal at the terminals 94, 86 respectively. The signal also drives the frequency meter 11. The vibration signal from the transducers at terminals 60, 61 passes through the preamplifier 113 and the conductor 114 to the switch deck 65D where the amplitude meter 10 receives an unfiltered signal corresponding to the actual vibration manifestations.

FILTER-OUT-FREQUENCY MODE

In the filter-out-frequency mode, the vibration signal from the transducer terminals 60, 61 is delivered through the preamplifier 113 to the amplitude meter 10 and also is delivered to the filter-out-frequency terminal of the switch deck 65B whence it drives the frequency meter 11 to indicate the frequency of the principal source of vibration in the vibration signal.

REFERENCE SIGNAL INPUT CIRCUITRY

Figure 11:
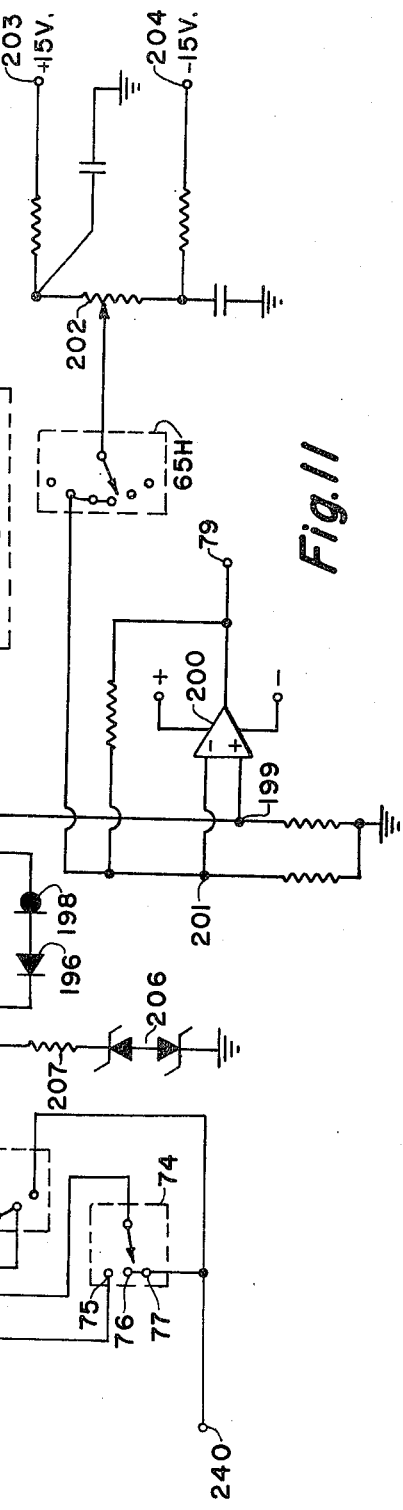
FIG. 11 is a schematic illustration of a pulse signal conditioning circuit.

The reference signal input circuitry 78 of FIG. 2 is more fully illustrated in FIG. 11 which will now be described. The purpose of the input circuitry 78 is to condition the input reference signal to produce a clean pulse corresponding with the principal pulse source and to eliminate electrical signals resulting from noise and surface discontinuities. The input signal is delivered from the wiper arm of the switch deck 65A through a coupling capacitor 192 to the input terminal 193 of the input signal circuit. The input terminal 193 is connected to a circuit 194 including a pair of steering diodes 195, 196 and a pair of constant current diodes 197, 198. The steering diodes 195, 196 accommodate both positive and negative pulses. The other end of the circuit 194 is connected to a positive terminal 199 of a comparator integrated circuit 200. The negative terminal 201 of the comparator 200 is connected through a switch deck 65H to a voltage divider 202 which is connected to a positive terminal 203 and a negative terminal 204. The voltage divider 202 applies a pre-selected threshold voltage to the negative terminal 201 of the comparator 200. The reference adjust knob 33 (FIG. 1) controls the threshold voltage of the voltage divider 202 to permit the operator to adapt the apparatus to specific conditions. The output of the reference signal circuit at the output terminal 205 is a pulse of constant amplitude corresponding to the intended input pulses applied from the input terminal 62. It will be observed that the terminal 193 is protected from overload voltages by a pair of back-to-back Zener diodes 206 and a biasing resistor 207. The circuitry shown in FIG. 11 in effect is a filter for the pulse input signals. Spurious signals of low amplitude are attenuated in the circuit. The clean pulse input signal is applied to a terminal 79 which appears in FIG. 2 and also appears in FIG. 9. FIG. 9 corresponds in some respects to FIG. 2 and illustrates certain components of the circuitry in greater detail. Referring now to FIG. 9, the pulse-to-sine and pulse-to-cosine circuitry will be described in greater detail.

The input terminal 79 receives a clean input pulse signal having a single pulse per revolution of a rotating body. The pulse is applied through an amplifier 208 to a one shot multi-vibrator 209 which develops a predetermined specific width pulse for each of the several filter frequency bands. The width of the pulse is about 1/1000 of the cycle. The pulse width from the one shot multi-vibrator 209 is determined by a setting of the switch deck 160E. The resulting signal at the output terminal 210 thus is a sharp pulse having a width of approximately 1/1000 of the cycle. This pulse signal, indicated as wave form A in FIG. 12, is applied to the base of a transistor 211 having its emitter connected to ground and its collector connected to the wiper arm of a switch deck 160F. The wiper of the switch deck 160F also is connected to a source of positive voltage at a terminal 212 through a constant current diode 213. It will be apparent that the switch deck 160F connects one of four R-C paths between the wiper arm and ground. The voltage developed across the selected R-C path is applied through a voltage follower 205 to one input terminal 234 of a free-running multi-vibrator 214. The constant current diode 213 allows the voltage to increase at a uniform rate during each cycle until a pulse is applied to the base of the transistor 211 at which instant the selected R-C elements discharge instantly through the switch deck 160F and the transistor 211. The signal developed at the input terminal 234 of the free-running multi-vibrator 214 thus is the wave form B shown in FIG. 12. The constant current application to the selected R-C components at the switch deck 160F causes a gradual and uniform increase in voltage up to the point where the pulse (wave form A of FIG. 12) is applied to the base of the transistor 211 causing the voltage to be tied back instantly to ground level. The free-running multi-vibrator 214 produces the square wave form C of FIG. 12. The multi-vibrator 214 develops a positive output when the voltage at the input terminal 234 exceeds the threshold setting which is applied to the other input terminal. In all other conditions the free-running multi-vibrator 214 produces a negative output. The threshold voltage applied to the other terminal of the free-running multi-vibrator 214 is adjusted by means of a voltage divider 215 including three resistors and two Zener diodes. The output of the free-running multi-vibrator 214 at the output terminal 216 is applied to the input terminal 99 of a circuit as shown in FIG. 17 which produces a square wave having an amplitude directly proportional to the frequency of the signal. The resulting signal at the terminal 107 is a square wave corresponding in phase with the square wave at terminal 216 but having an amplitude corresponding to the frequency of the signal. That signal from the terminal 107 is delivered through an integrating circuit 84 to produce a signal having a triangular wave form corresponding to wave form D of FIG. 12. The resulting triangular wave is shaped into a corresponding sine wave signal of the wave form K in FIG. 12 by means of a sine wave shaping circuit 85. The resulting sine wave is delivered to an output terminal 86. This signal has a peak value synchronous with each of the pulses of wave form A applied to the input terminal 79 of FIG. 9.

Figure 12:
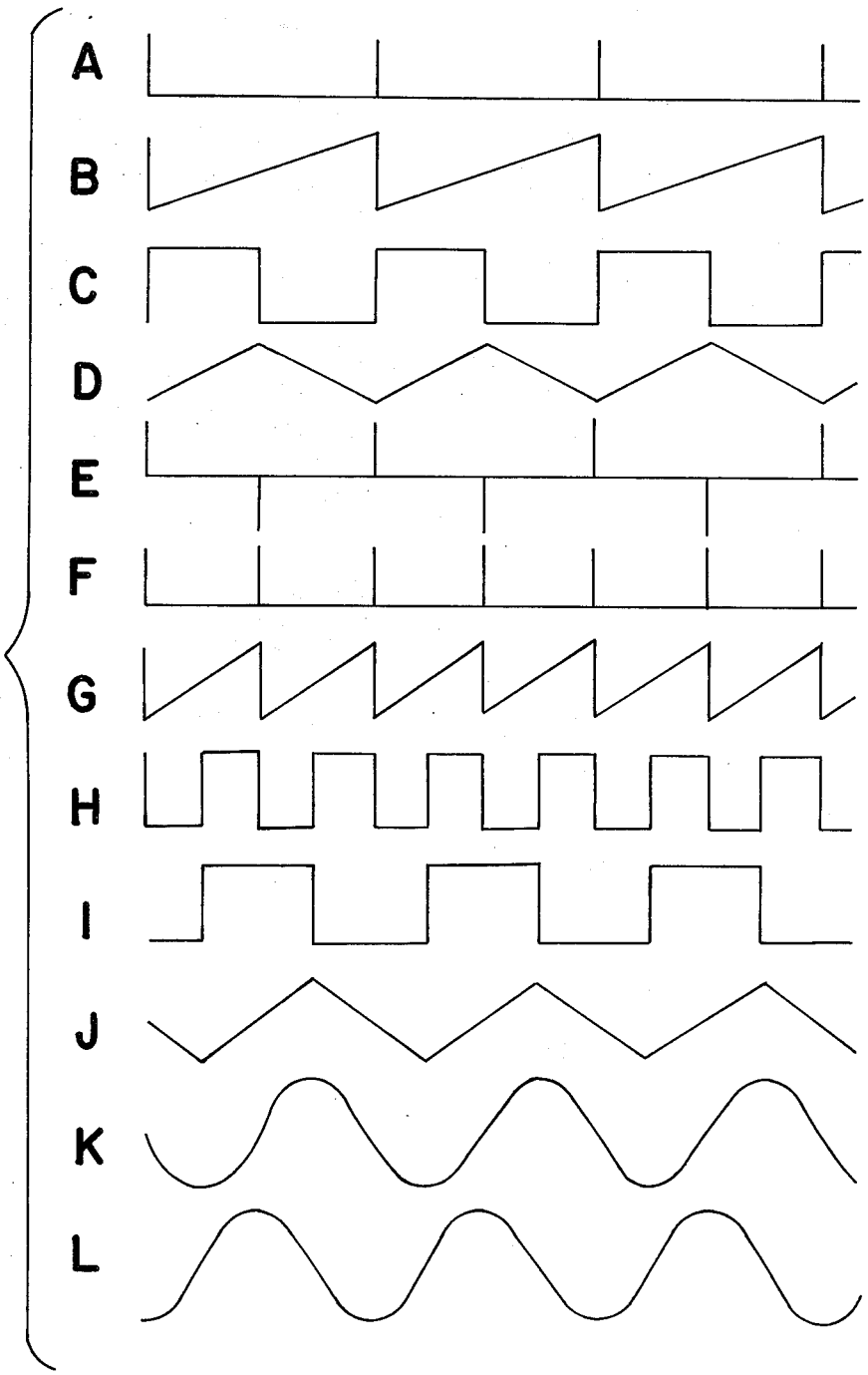
FIG. 12 is a series of phase-aligned wave forms illustrating certain signals within the pulse-to-sine wave and pulse-to-cosine wave circuitry of FIG. 9.

The square wave signal from the terminal 99 also is delivered through a coupling capacitor to the base of a transistor 218 which functions as a differentiating circuit to convert the wave form C (FIG. 12) to the wave form E (FIG. 12). Each reversal of current flow from the wave form C generates one of the pulses in the wave form E. The wave form E is delivered to the base of a transistor 219 which is connected to a flip-flop multi-vibrator integrated circuit 220. The combination of the transistor 219 and flip-flop multi-vibrator 220 converts the wave form E into the wave form F (FIG. 12) wherein all of the pulses are positive. The wave form F is applied to a one shot multi-vibrator 221 which has R-C time constants determined by the setting of the switch deck 160G so that the pulses of wave form F are converted into output pulses having a fixed pulse width and a pre-established pulse amplitude. The pulse width is designed to be approximately 1/1000 of the cycle. The resulting pulse signal is applied to the base of the transistor 222 which is connected across a switch deck 160H in the same manner that the transistor 211 is connected across the switch deck 160F. A constant current diode 223 delivers current at a constant flow rate from a positive terminal source 224 through the wiper arm of the switch deck 160H into a selected one of four R-C circuits according to the frequency band established at the switch deck 160H, i.e., the knob 17 of FIG. 1. The resulting signal is delivered through a voltage follower 225 to the input terminal 235 of a free-running multi-vibrator 226. The signal applied to the voltage follower 225 is the wave form G (FIG. 12), a sawtooth wave generated from the input wave F in the same manner that the sawtooth wave B was generated from the wave form A (FIG. 12).

In the free-running multi-vibrator 226, the sawtooth wave form G is converted to a square wave form H at the output terminal 228 in the same manner that the free-running multi-vibrator 214 produced a square wave form C as an output signal from an input signal corresponding to the sawtooth wave form B (FIG. 12). A threshold voltage is applied to the negative terminal of the free-running multi-vibrator 226 from a voltage divider 227 so that the output signal at the output terminal 228 is positive when the sawtooth wave form G is positive and the output signal is negative when the sawtooth wave form G is negative. The wave form H is a square wave having twice the frequency of the wave form C. The wave form H is delivered from the output terminal 228 to the base of a transistor 229 which is connected to a flip-flop multi-vibrator 230. The flip-flop multi-vibrator 230 reverses direction of current flow with each positive pulse applied to the unit. Thus the wave form H (FIG. 12) is converted to the wave form I (FIG. 12) at the output terminal 231 of the flip-flop multi-vibrator 230. The wave form I is delivered to a terminal 99' and through a circuit corresponding to the circuitry of FIG. 17 to produce an output signal at an output terminal 107' which is a square wave having an amplitude linearly proportional to the frequency of the signal. The square wave is integrated in an integrator 92 to produce at the output terminal 232 of the integrator 92 a triangle wave form J whose amplitude is independent of frequency. It is a function of integrator 92 to produce an output having an amplitude 1/f times the amplitude of the input signal, wherein $f$ indicates frequency. Inasmuch as the input signal has been multiplied by $f$ (frequency) in the circuitry of FIG. 17, the amplitude of the signal at the terminal 232 is the same as the amplitude of the signal at 231.

Wave form J is delivered from the terminal 232 through a sine wave shaping circuit 93 to produce a sine wave form L (FIG. 12) at the terminal 94. It will be observed that the wave form L is 90° displaced from the wave form K and accordingly can be categorized as a cosine wave if the wave form K is characterized as a sine wave.

ERROR GATE CIRCUITRY

Because the wave forms K and L are separated by 90°, it is important to maintain either a leading or a lagging relationship to avoid ambiguities. Error gate circuitry 140 of FIG. 2 is provided to maintain the desired relationship. The error gate circuitry 140 is better illustrated in FIG. 18.

The cosine signal (wave form L) is developed as a cosine square wave (wave form J) derived from the sine square wave (wave form C). The signal is developed in a flip-flop multi-vibrator 230 which is free-running and which conducts either positively or negatively. Thus it is feasible for the cosine output signal at the terminal 231 to be 180° out of phase with the intended cosine signal. To preclude this result, the error gate 140 is provided. The error gate 140 is a NAN gate which receives as input the square wave signal from the terminal 99 and also receives the output signal from the flip-flop multi-vibrator 230, terminal J, through a conductor 233. A diode 234 allows only the positive half of the square wave signal from terminal 99 to be applied to the gate 140. The two input terminals of the gate 140 are tied together electrically.

Figure 18:
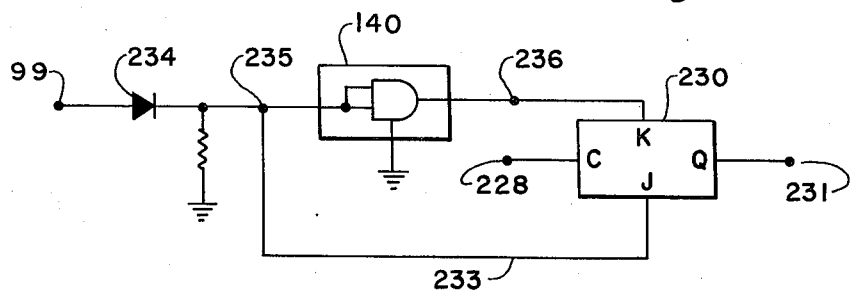
FIG. 18 is a schematic illustration of the error gate circuitry appearing in FIG. 2.
Figure 19:
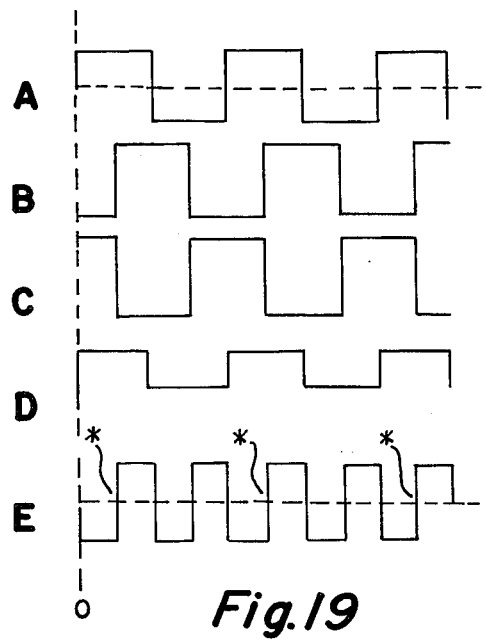
FIG. 19 is a series of phase-aligned wave forms illustrating electrical signals related to FIG. 18.

The phase relation of the various signals can be illustrated by a phase aligned series of wave forms in FIG. 19. The wave form 19A indicates a square wave which is applied at the terminal 99, designated as a sine wave since, as shown in FIG. 19, its positive zero axis crossing occurs at time zero. The wave form 19B is correspondingly a cosine square wave which is the desired output at the terminal 231. The wave form 19C is a corresponding cosine square wave output which is displaced from the cosine square wave 19B by 180°. The wave form 19C will introduce ambiguities into the system and must be avoided. The circuitry shown in FIG. 18 is intended to avoid the ambiguities. The wave form 19D is the rectified sine square wave form A as it appears at a terminal 235 in FIG. 18. The wave form 19E is the twice frequency square wave which is applied at terminal 228.

The error gate 140 is an inverting gate which receives an input signal and delivers the opposite output signal. Thus a "high" applied to the terminal 235 will produce a "low" at terminal 236. The flip-flop multi-vibrator 230 is so arranged that the output signal at the terminal 231 can be shifted to a "high" only when a "high" is applied at the terminal 235 and a corresponding "low" applied to the terminal 236. This condition is satisfied only in the "high" positions shown in wave form 19D. This occurs only at the transitions of wave form 19E which are marked with an asterisk in wave form 19E. Thus the output from the flip-flop multivibrator 230 at the terminal 231 is always the desired cosine square wave form 19B and cannot be the undesired cosine square wave form 19C. The particular logic elements which are employed to accomplish this error avoidance can be inverted and reversed in accordance with well-understood principles of electrical logic elements.

Digital Sweep Circuitry

Figure 20:
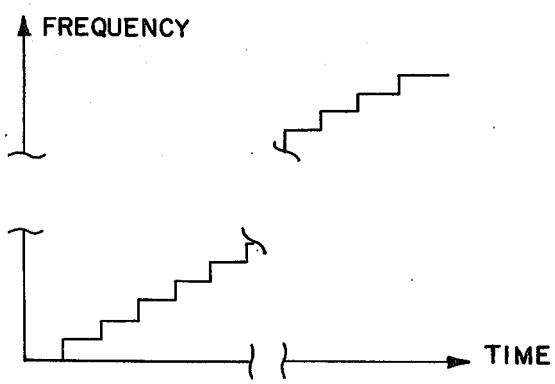
FIG. 20 is a graphical representation of the digital sweep circuit output signal.

The digital sweep circuitry of this invention will now be described by reference to FIGS. 15 and 20. The function of the digital sweep circuitry is to produce a driving signal which increases linearly in frequency with respect to time. The output signal in FIG. 2 is delivered at an output terminal 240. The digital sweep circuit develops a signal whose frequency increases in incremental uniform steps uniformly with time in the manner shown graphically in FIG. 20. In a preferred embodiment of the invention, a total of 2,000 increments is provided over the selected range of operation. By adjusting a minimum frequency knob 29 (FIG. 1 and FIG. 15) the initial frequency can be selected as a fraction of the total range. By adjusting a maximum frequency knob 30 (FIG. 1 and FIG. 15) which is ganged mechanically to the switches 30A, 30B (FIG. 15) it is possible to adjust the maximum range of the frequency scan. The overall ranges may be adjusted with the knob 17 (FIG. 1) which corresponds to switch decks 160I and 160J of FIG. 15.

Figure 15:
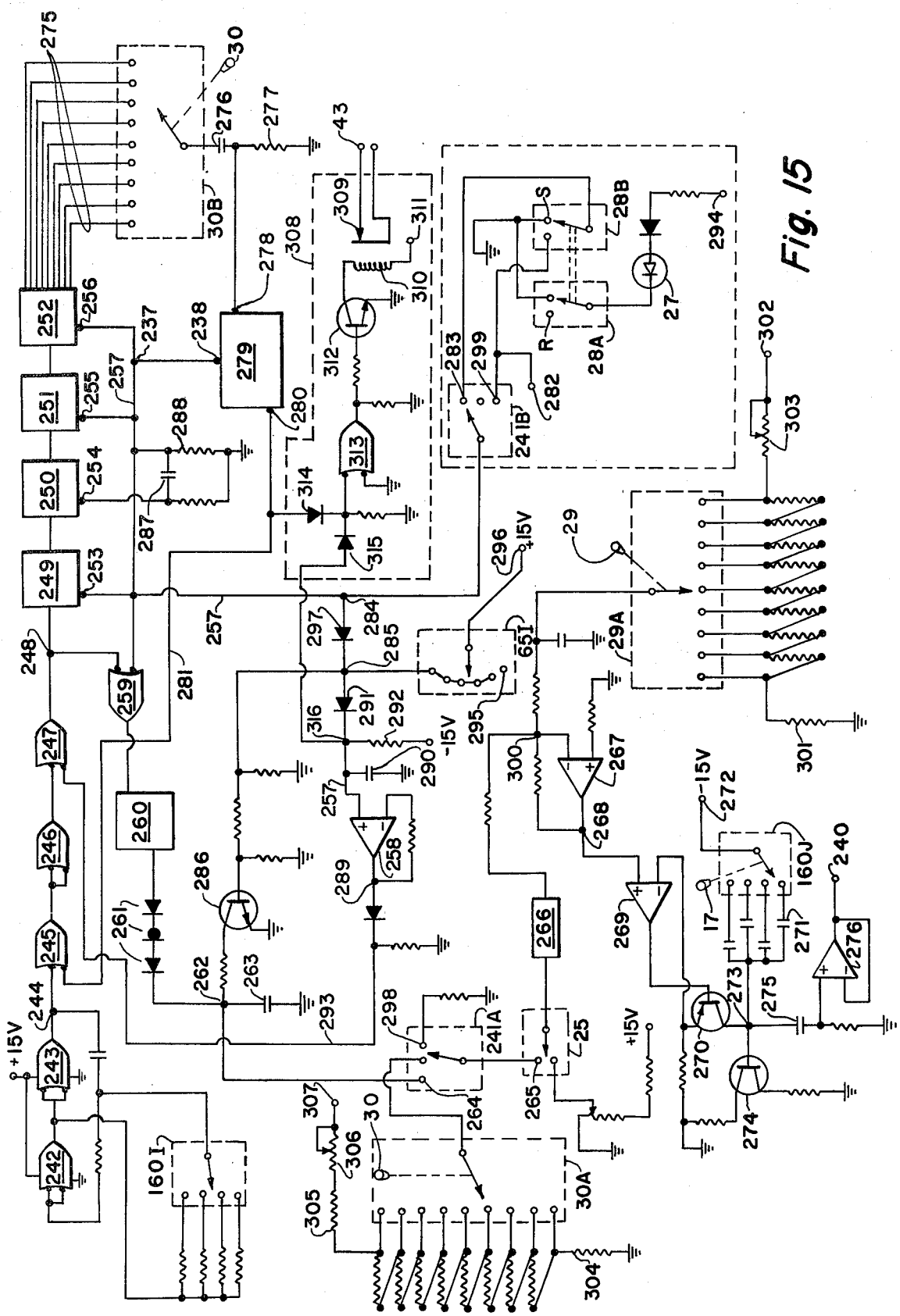
FIG. 15 is a schematic illustration of digital sweep circuitry for generating a linear frequency sweep signal which is employed in the spectrum analysis mode of the apparatus.

The recorder selector knob 26 of FIG. 1 includes two decks, 241A, 241B, in FIG. 15. The spectrum analysis toggle switch 25 appears in FIG. 15. The reset button 28 appears as two switch decks 28A, 28B in FIG. 15. The indicator light 27 appears as a light-emitting diode 27 in FIG. 15.

The operation of the digital sweep circuit will now be described. The upper left hand corner of FIG. 15 includes a pair of electron gates 242, 243 connected in series with an R-C circuit to generate a square wave signal at an output terminal 244 having a fixed frequency corresponding to the R-C constants of the circuit. The R-C constants are adjusted at the switch 160I which is automatically positioned when the frequency range knob 17 is positioned. The signal appearing at the output terminal 244 is a square wave which is delivered through three electron gates including a latch gate 245, an inverter 246 and a time delay gate 247. The gates 245, 247 are arranged to deliver the applied square wave signal so long as the control terminals are "low." The inverter 246 merely changes a "high" to a "low" and changes a "low" to a "high" in order to accommodate subsequent circuitry requirements. A square wave clock signal thus is applied to a clock terminal 248.

A chain of counters 249, 250, 251, 252 is provided to count 2,000 pulses of the square wave applied at the clock terminal 248. In a preferred embodiment illustrated in FIG. 15, the counters 249, 251, 252 are Johnson counters having a 10-to-1 counting capacity. The counter 250 is D-type flip-flop multi-vibrator which has a two-times counting capability. The counters are arranged so that the final counter 252 has nine output terminals connected to nine corresponding switch terminals of the switch deck 30B. The wiper arm of the switch deck 30B can be shifted from its normally "low" output state to a "high" output state at 10 percent increments over the range of 2,000 counts, i.e., at 200 counts, 400 counts, 600 counts...1600 counts, 1800 counts and 2000 counts. The counters 249, 250, 251, 252 have control terminals 253, 254, 255, 256 respectively which must be in a "low" state in order for the counters to operate. All of the control terminals 249, 250, 251, 252 are connected to a reset conductor 257 which extends from the terminals 253, 254, 255, 256 through diodes 297, 291 to an integrated circuit 258 hereinafter to be described.

The clock signal from the clock terminal 248 also is delivered through a control gate 259 to a one shot multivibrator 260 which converts the square wave clock signal into corresponding electrical pulses each having a precisely uniform pulse and a precisely uniform pulse amplitude. Thus each of the pulses from the one shot multi-vibrator 260 has a predetermined charge. The pulses are delivered through a constant current diode chain 261 to a charge terminal 262 which is connected to a charging capacitor 263. The charge on the capacitor 263 increases in uniform steps with each pulse from the one shot multi-vibrator 260. Accordingly the voltage which is developed at the charge terminal 262 increases in uniform steps uniformly with time. The voltage from the charging terminal 262 is thereafter converted to a corresponding electrical current which is in turn converted to an electrical signal of corresponding frequency as will not be described. The stepwise increasing voltage from the charge terminal 262 is delivered through the "operate" terminal 264 of a switch deck 241A to the "automatic" terminal 265 of the switch deck 25A and thence through a voltage follower 266 to an inverter 267. The inverter 267 is provided to accommodate the succeeding circuitry requirements. The inverted signal is delivered from an output terminal 268 of the inverter 267 to an integrated circuit amplifier 269 having a transistor 270 in its feedback circuit. A characteristic of this circuit is that the current flowing through the transistor 270 corresponds with the applied voltage from the terminal 268. The collector of the transistor 270 is connected through one of the capacitors 271 to a source 272 of negative voltage. One of the capacitors 271 is automatically selected as the frequency range knob 17 (FIG. 1) sets the wiper arm of the switch deck 160J. The selected capacitor 271 is drained of its charge by the current flowing through the transistor 270. The voltage at a terminal 273 between the selected capacitor 271 and the emitter of the transistor 270 thus increases at a rate depending upon the current flowing through the transistor 270. The terminal 273 is connected to the base of a unijunction transistor 274. When the voltage at the terminal 273 exceeds the breakdown voltage of the unijunction transistor 274, the remaining charge on the selected capacitor 271 is discharged through the unijunction transistor 274. Thus the voltage at the terminal 273 drops to zero as the terminal 273 is grounded through the unijunction transistor 274. Instantly the unijunction transistor 274 becomes nonconductive and the voltage at the terminal 273 is permitted to increase again at a rate which is determined by the current flowing through the transistor 270. Thus when the current flowing through the transistor 270 is relatively small (corresponding to a relatively small voltage at the terminals 262, 268) the time required for the selected capacitor 271 to become charged is relatively long. The wave length of the sawtooth wave at the terminal 273 is thus relatively long. As the current flowing through the transistor 270 increases (corresponding to increased voltages at the terminals 262, 268) the time required for the selected capacitor 271 to become charged decreases so that the wave length of the sawtooth signal at the terminal 273 is shorter. Thus the frequency of the electrical signal at the terminal 273 is proportional to the voltage at the terminals 262, 268. Inasmuch as the voltage at the terminal 262 increases in uniform steps, uniformly with time, the frequency of the signal at the terminal 273 likewise increases in uniform steps uniformly with time. The signal from the terminal 273 is delivered through a coupling capacitor 275 to an integrated circuit 276, functioning as a buffer, to an output terminal 240. The output terminal 240 appears in FIG. 2 as the terminal from which a signal is applied to the spectrum analysis terminal of the switch deck 65A when the system is operating in the spectrum analysis mode.

Reverting to the clock terminal 248, the square wave clock signal is delivered through the counters 249, 250, 251, 252 until the counters have exhausted their counting capacity at which time the normally "low" state at the output terminal 275 is switched to a "high" state. The transition is applied through the switch deck 30B and is integrated in a capacitor 276 and resistor 277 to produce a spike or pulse at the input terminal 278 of a flip-flop multi-vibrator 279. The flip-flop multi-vibrator 279 has a normally "low" state at its output terminal 280. The "low" state is applied to a conductor 281 and to the operating terminal of the latch gate 245 thus maintaining the gate 245 open during normal operation. The appearance of a pulse at the output terminal 278 of the flip-flop multi-vibrator 279 converts the state of the output terminal 280 to a "high". The "high" is applied to the conductor 281 and to the operating terminal of the latch gate 245 thereby disabling the gate 245 so that no further signals are delivered to the clock terminal 248 when the maximum frequency has been achieved.

When the maximum frequency has been achieved and the output terminal 280 of the flip-flop multi-vibrator 279 is in a "high" state, the capacitor 263 remains fully charged for significant periods of time inasmuch as low leadage components are employed. The system can be reset for renewed operation by depressing the reset button 28 which has two decks 28A, 28B. The reset position is marked R and the start position is marked S in FIG. 15. When the switch 28 is moved to the R position, a positive voltage from a positive source terminal 282 is delivered through the switch deck 28B to the "operate" terminal 283 of the switch deck 241B and thence to a reset terminal 284 in the reset conductors 257. So long as the reset switch 28 remains in the reset position R, the reset conductor 257 is connected to the positive voltage source 282.

Application of the positive voltage to the reset conductor 257 accomplishes a number of results.

The positive voltage is delivered from a terminal 285 to the base of a transistor 286. Accordingly the transistor 286 becomes conducting and the capacitor 263 is discharged to ground.

The positive voltage from the reset terminal 284 is delivered through the conductor 257 to the control terminals 253, 254, 255, 256 of the counters 249, 250, 251, 252 respectively, thereby resetting each of the counters to zero. It will be observed that the counter 250 which is a D-type flip-flop multi-vibrator is connected to the conductor 257 through an integrator consisting of a capacitor 287 and a resistor 288 which applies a pulse to the control terminal 254 as required to reverse the state of a D-type flip-flop multi-vibrator 250.

When the system is started for a further spectrum analysis activity, the reset button 28 is moved to the start position S. This disconnects the positive source 282 and provides a path for grounding the potential of the reset conductor 257. A terminal 237 in the reset conductor 257 is connected to a reset terminal 238 of the flip-flop multi-vibrator 279. As the state of the terminal 287 shifts from "high" to "low," the output terminal 280 of the flip-flop multi-vibrator 279 also reverts from the "high" state to a "low" state. The "low" state is applied to the conductor 281 and to the operating terminal of the latch gate 245, enabling the clock signal to pass into the inverter 246 and to the clock terminal 248.

Removal of the voltage from the base of the transistor 286 renders the transistor 286 nonconductive so that the capacitor 263 may be recharged.

Time Delay Circuit

A time delay circuit is provided in the system to allow the synchronous filters (FIG. 10) to settle inasmuch as the applied frequency is being changed from the maximum frequency to a minimum frequency. Normally about an eight seconds time delay is adequate. The time delay circuitry includes an electron switch 258 (FIG. 15) having its positive terminal connected to the reset conductor 257. The output of the electron switch 258 is applied to the control terminal of the time delay gate 247. Normally the output terminal 289 of the electron switch 258 is maintained in a "low" state. During the reset operation, a capacitor 290 becomes charged to the 15 volts value of the reset conductor 257.

A diode 291 is provided in the reset conductor 257 between the reset terminal 284 and the electron switch 258. Thus when the 15 volts source 282 is disconnected from the reset conductor 257 and the reset terminal 284 is connected to ground through the start terminal S of the switch deck 28B, the 15 volts potential slowly discharges from the capacitor 290 through a resistor 292. When the potential at the positive terminal of the electron switch 258 drops below the threshold, the output 289 changes state from "high" to "low" and applies a "low" through a time delay conductor 293 to the control terminal of a time delay gate 247.

The reset button 28 in the start position also connects a power source terminal 294 through a light emitting diode 27 via the switch deck 28A to ground. Thus the light emitting diode 27 ignites when the reset switch 28 is in the start position. This is particularly important because of the time delay circuitry just described. In the absence of a light emitting diode 27, the system operator might not be aware that the system was connected because of the eight seconds time delay normally built into the system.

The digital sweep circuit operates only during the spectrum analysis mode. The switch deck 65I has all of its terminals except the spectrum analysis terminal 295 connected through its wiper arm to a source 296 of positive voltage at about 15 volts. The remaining terminals of the switch deck 65I are connected to the terminal 285 in the reset conductor line 257 between a pair of diodes 291, 297. Thus a 15 volts source is applied to the base of the transistor 286 in all modes except spectrum analysis to preclude build-up of voltage at the charge terminal 262. Similarly the 15 volt source is applied through the terminal 285 to the electronic switch 258 to disable the time delay gate 247.

FREQUENCY RANGE ADJUSTMENTS

The range adjustments are made for minimum frequency with the recorder selector knob 26 in the "zero calibrate" position and for maximum frequency with the recorder selector knob 26 in the "full scale" calibrate position.

To set the minimum frequency the switch decks 241A, 241B have the wiper arms connected to the "zero calibrate" terminals 298, 299. In this position, the positive voltage source 282 is connected through the "zero calibrate" terminal 299 of the switch deck 241B to the reset terminal 284, thereby inactivating the clock signals at clock terminal 248. A mixer terminal 300 is connected to ground through the voltage follower 266, the switch deck 25A and the zero calibrate terminal 298 of the switch deck 241A. The mixer terminal 300 also is connected to the wiper arm of the minimum frequency switch deck 29A. The minimum frequency switch deck 29A has nine terminals which are connected to each other by single resistors in a chain. One end resistor is connected to ground through a resistor 301. The other end terminal is connected to a source 302 of positive voltage through a rheostat 303. Thus the voltage applied to the wiper arm of the switch deck 29A can be varied in uniform increments. This voltage is applied to the mixer terminal 300 and thence through the inverter 267 to the positive terminal of the integrated circuit 269. This constant uniform voltage from the mixer terminal 300 will develop a uniform frequency output signal at the output terminal 240. This signal can be observed on the frequency meter 11 (FIG. 1 and FIG. 2). Referring specifically to FIG. 2 the frequency signal is delivered from the terminal 240 through the spectrum analysis terminal of the switch deck 65A and thence through the input circuit 78 to the spectrum analysis terminal of the switch deck 65B. The signal is taken from the switch deck 65B through the frequency-to-DC converter 95 and the DC amplifier 96 whence it is applied to the frequency meter 11.

The "full scale" calibration of the system is carried out with the switch decks 241A, 241B in the "full scale" calibrate position, that is with the wiper arm connected to the central terminal in the switch decks 241. Referring to the switch deck 241A, it will be observed that the "full scale" calibrate terminal is connected to the wiper arm of the switch 30A. The switch 30A has nine terminals which are connected to each other by resistors in a chain. The bottom terminal is connected by a resistor 304 to ground. The top terminal is connected by a resistor 305 and a rheostat 306 to a positive source 307, normally 15 volts. Thus a suitable voltage can be applied in uniform increments through the terminals of the switch 30A to the switch deck 241A and thence through the switch 25A and voltage follower 266 to the mixer terminal 300. At the mixer terminal 300 the voltage applied from the switch deck 30A is mixed with the already established voltage from the switch deck 29A. So long as the voltage from the switch deck 30A exceeds the voltage from the switch deck 29A, a signal will be developed at the output terminal 240 corresponding to the difference between the voltage from the deck 30A and the voltage from the deck 29A. The frequency of that signal at terminal 240 can be indicated directly on the frequency meter 11 of FIG. 1 and FIG. 2.

If the instrument is operating in the frequency band from 600 Hertz to 6,000 Hertz as a result of the setting of the frequency range knob 17 and the corresponding switch decks 160, the minimum frequency knob 29 and maximum frequency knob 30 will permit the operator to inspect and to record all of the range or less than all of the range. For example, the operator can observe and record frequencies from 1,800 to 4,200 Hertz. This smaller range may be spread entirely across the X–Y coordinate paper (of an X–Y recorder) for enlarged scale plotting of the observations. It will be observed that the maximum frequency knob 30 is mechanically connected to the switch deck 30B associated with the last Johnson counter 252. Thus when the maximum frequency is established by the knob 30, the corresponding range of the counter chain is established so that the remainder of the circuitry shuts down at the desired maximum frequency.

The minimum frequency adjustment knob 29 applies a threshold voltage at the mixer terminal 300 corresponding to the setting of the knob 29. For example if the system is in the 600–6,000 cycle frequency range and the desired sweep is from 2,400 to 6,000 cycles, the voltage delivered from the switch 29 to the mixer point will be a voltage corresponding to 2,400 cycles. Thus the output signal at the terminal 240 resulting directly from the voltage at mixer terminal 300 from switch 29 will be a 2,400 cycle signal. Thereafter as the system starts up, the voltage at the charge terminal 262 increases from zero and the resulting signal at the output terminal 240 increases in frequency from the established base of 2,400 cycles.

When the maximum frequency switch 30 thereafter is adjusted with the switch 241A in the "full scale" calibrate position, the voltage from the switch deck 30A is added to the voltage from the switch deck 29A at the mixer terminal 300. If the full scale voltage from the switch deck 30A were to be applied in the example, the output signal at the terminal 240 would correspond to 8,400 cycles, that is 2,400 cycles resulting from the electrical signal delivered from the switch deck 29A and 6,000 cycles resulting from the full scale voltage delivered from the switch deck 30A. In order that the output frequency will be within the desired range, that is 2,400–6,000 cycles, the switch 30 is adjusted until the frequency meter 11 (FIG. 1 and 2) indicates 6,000 cycles. The adjustment of the switch 30 also adjusts the swtich deck 30B and reduces the counting excursion of the counter chain correspondingly. Thus in the given example where the normal range is 600 to 6,000 cycles per second, the total range is 5,400 cycles. The normal counting excursion of the counter chain is 2,000 counts. Hence the normal counting rate is 2.7 Hertz per count. Thus if 30 percent of the lower portion of the range is to be eliminated, this is 0.3 times 5,400 Hertz equals 1,620 hertz above the 600 Hertz threshold. Thus the final range would be 2,200 to 6,000 Hertz. The counter 252, FIG. 15, would terminate counting after 1,400 counts.

PEN LIFT CIRCUIT

A pen lift circuit is illustrated by the broken line enclosure 308 in FIG. 15. The pen lift circuit includes a pen lift outlet 43 having a solenoid switch 309 including a coil 310 which is connected to a source 311 of positive voltage and through a transistor 312 to ground. The base of the transistor 312 is connected to the output terminal of a gate 313. The control terminal of the gate 313 is connected through a diode 314 to the conductor 281. The control terminal of the gate 313 also is connected through a diode 315 to a terminal 316 in the reset conductor 257. When the base of the transistor 312 receives a positive charge, the transistor 312 becomes conducting, current flows through the solenoid coil 310 and the pen lift circuit 43 is closed. The base of the transistor 312 receives a charge when the control terminal of the gate 313 is "low." The control terminal of the gate 313 will be "low" when the conductor 281 is "low" and when the terminal 316 is "low." The conductor 281 is "low" so long as the counter chain 249, 250, 251, 252 is actively counting. As soon as the counting terminates, the terminal 280 of the flip-flop multi-vibrator 279 becomes "high" and this causes the gate 313 to develop a "low" at its output terminal which is applied to the base of the transistor 312, which interrupts the flow of current through the transistor 312 and through the solenoid coil 310. The terminal 316 also is "high" when the reset switch 28B is in the reset position R. The terminal 316 remains "high" after the reset switch 28B has been moved to the start position S until the delay circuit capacitor 290 discharges. This requires about eight seconds. Hence the pen lift circuit 308 is activated at the same instant that the activating signal is delivered from the delay circuit through the conductor 293 to the time delay gate 247.

TYPICAL OPERATION

Figure 13:
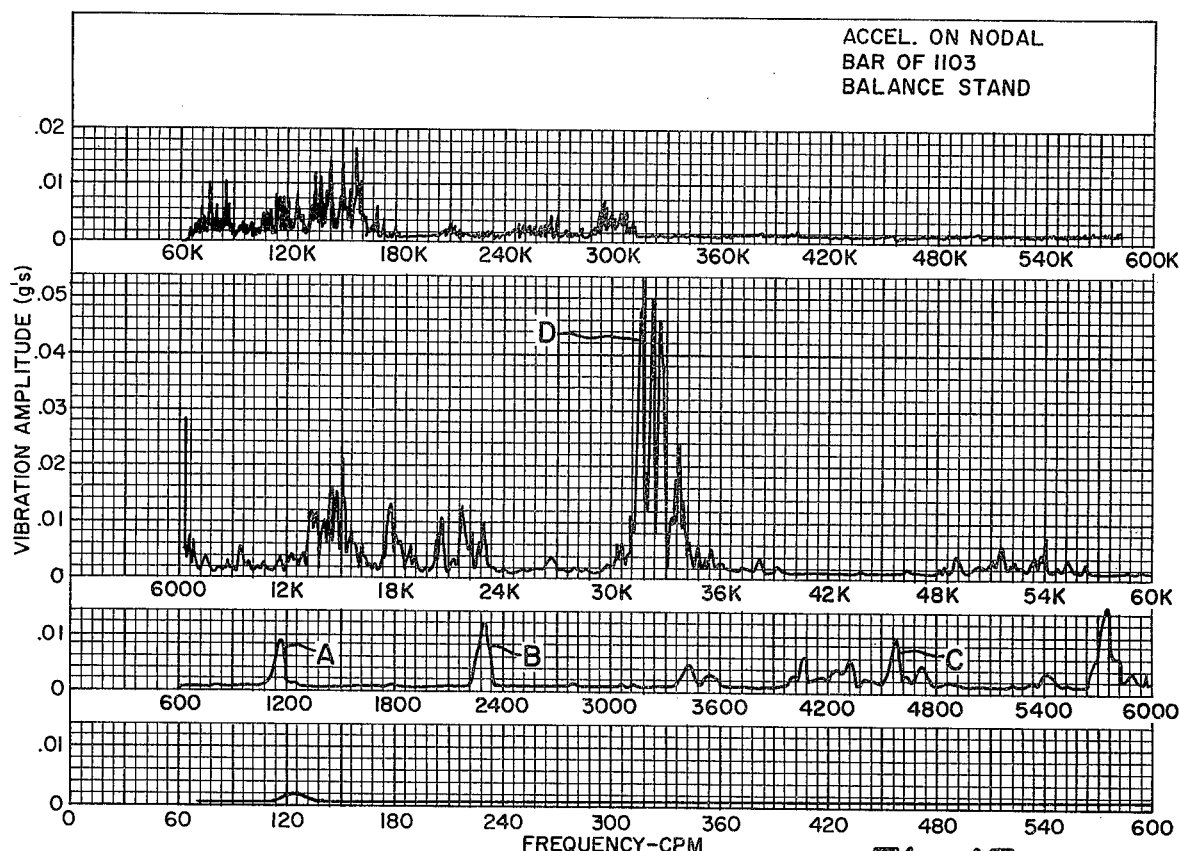
FIG. 13 is a typical printout obtained by spectrum analysis of a fan unit rotating at 1,150 rpm.

FIG. 13 sets forth the type of information which can be obtained from the present system in the spectrum analysis mode over each of the four typical cycles, 60–600 Hertz; 600–6,000 Hertz; 6,000–60,000 Hertz; 60,000–600,000 Hertz. The plot shown in FIG. 13 illustrates the vibration amplitude as a vertical indication plotted against the frequency of observation for a commercial fan rotating at 1,150 revolutions per minute. One spike is observed at the point A at about 1,150 rpm, the rotational frequency. Another spike B is observed at about 2,300 rpm, twice frequency. Another spike C occurs at 4,600 rpm, four times frequency.

The plot shows a significant vibration D at 30,000–36,000 cycles per minute, a phenomenon which is characteristic of a defective bearing in the system.

The four printout lines in FIG. 13 represent a vibration signature for the particular fan unit under inspection. The printout of FIG. 13 can be obtained by an operator and retained in his files for future comparison with the corresponding signature developed from the same machine at a later date. Such comparisons are diagnostically useful.

Figure 14:
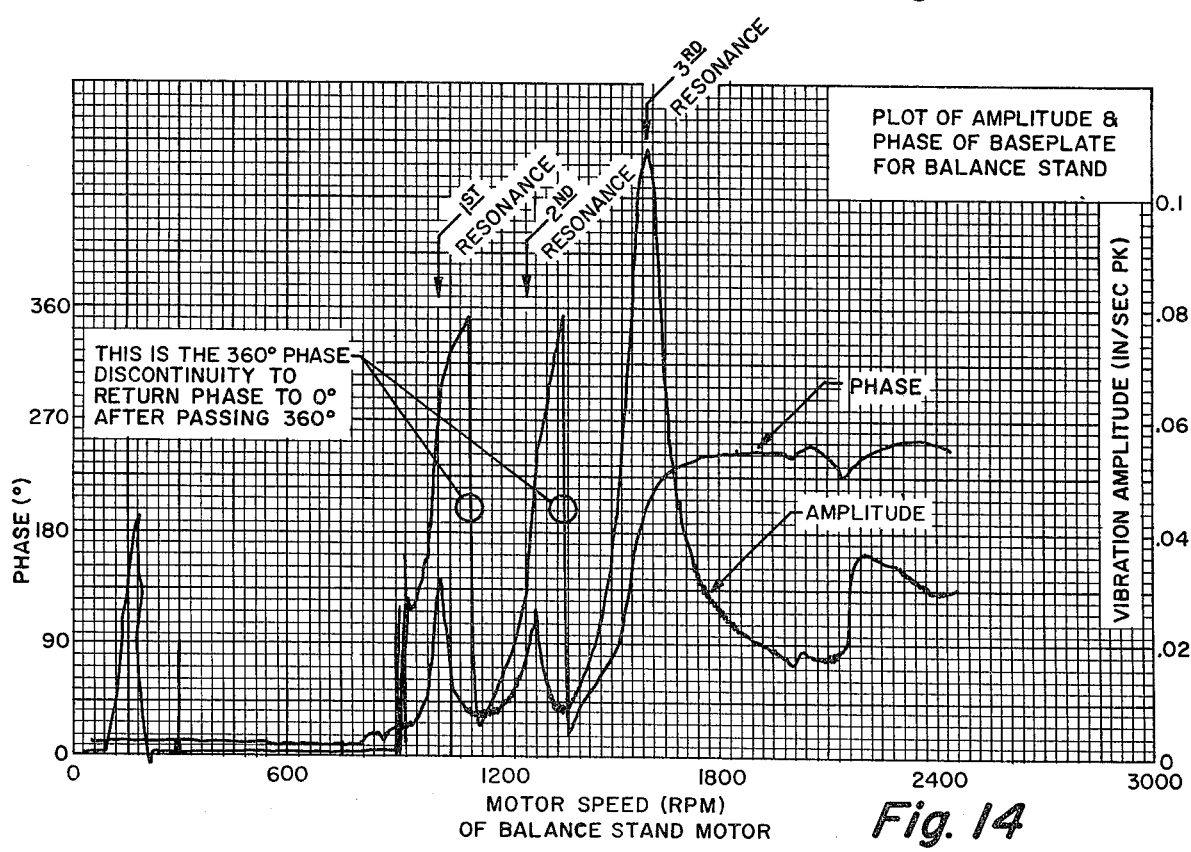
FIG. 14 is a printout obtained when the instrument is employed in the tracking mode illustrating the phase and amplitude manifestations of an electric motor rotor.

FIG. 14 illustrates a typical printout for the present system in the tracking mode. Amplitude is plotted vertically; frequency is plotted horizontally. The solid line curve shows the amplitude of vibration for the rotating body as its speed increases from 0 through 2,500 rpm. It will be observed that there are three significant peaks at 1,025 rpm, 1,275 rpm and 1,700 rpm.

The broken line curve shows the printout of the phase relationship of the output signal as the rotor increases in speed. Three distinct resonances are indicated at frequencies of about 1,050 rpm, 1,350 rpm and 1,600 rpm. A reversal of the phase relationship of the unbalance indication is characteristic of a frequency resonance.

VIBRATION SIGNAL CONDITIONER

A feature of this system is interchangeability of vibration pickups, including seismic transducers, non-contact pickups and accelerometers. The accelerometer input is applied to the terminal 61 of FIG. 8 whereas the velocity or displacement pickups are applied to the input terminal 60 of FIG. 8.

The velocity or displacement pickup signal is delivered through a preamplifier 317 to the two velocity terminals 318a, 319a of the deck 23A of the pickup selector switch 23. The accelerometer input signal is delivered from the terminal 61 through a charge amplifier 322 and a preamplifier 323 to the accelerometer input terminals 320a, 321a of the switch deck 23A. The signal from the switch deck 23A may be passed directly to the terminals 319b, 320b of the switch deck 23B or may be delivered through an active integrator 324 through potentiometers 325 or 326 to the terminals 318b or 321b respectively of the switch deck 23B.

The signal conditioning circuit of FIG. 8 delivers an output signal at a terminal 327 to the switch deck 65C as shown in FIG. 2. The signal will be a cyclic signal. The signal will correspond to displacement when the switch 23 is connected to the terminals 318; the signal at the terminal 327 will correspond to velocity when the switch 23 is connected to the terminals 319 or 321; the signal at terminal 327 will correspond to acceleration when the switch 23 is connected to the terminals 320.

We claim:

1. In an electro-mechanical apparatus for detecting instantaneous amplitude of harmonic vibrations of a rotating body including:
 an electromagnetic transducer for converting instantaneously some function of harmonic displacement into a complex electrical signal having a fundamental frequency corresponding to the instantaneous rotational velocity of said rotating body, the improvement comprising:
 independent means for generating a reference signal having uniformly increasing frequency said means being distinct from the said rotating body and also being distinct from said electromechanical transducer;
 signal filter means connected to receive the said complex electrical signal;
 signal filter means being responsive to said reference signal for instantaneously producing a resultant signal substantially free of components of the said complex electrical signal other than those at the existing instantaneous frequency of the said reference signal.

2. Apparatus according to claim 1 including means for adjusting the minimum frequency and the maximum frequency of the range of the said reference signal.

3. In an electro-mechanical apparatus of claim 1 the improvement comprising:
 switch means within said apparatus including two input terminals and one output terminal,
 integrating circuitry having an input contact and an output contact, said switch means being adapted to connect:
  a. a first of said input terminals to the said input contact and to connect the said output contact to the said output terminal;
  b. a first of said input terminals to the said output terminal;
  c. a second of the said input terminals to the said output terminal;
  d. a second of the said input terminals to the said input contact and to connect the said output contact to the said output terminal;
 and means for connecting said transducer to said first of said input terminals when the said complex electrical signal is velocity responsive and means for connecting the said transducer to the said second of said input terminals when the said complex electrical signal is acceleration responsive and means for connecting said transducer to the said first of said input terminals when the said complex electrical signal is displacement responsive.

4. In an electro-mechanical apparatus of claim 1, the improvement in said signal filter means comprising an active filter having the equivalent of a four-pole filter response with the equivalent of a two-pole filter delay.

5. In an electro-mechanical apparatus for detecting amplitude and phase relationships of harmonic vibrations of a rotating body, including:
- an electromagnetic transducer for converting instantaneously some function of harmonic displacement into a complex electrical signal having a fundamental frequency corresponding to the instantaneous rotational velocity of the said rotating body, including means for filtering the said complex electrical signal to suppress signal components at frequencies other than a selected frequency and to pass without significant distortion the signal components of the said selected frequency;
- a first signal channel and second signal channel, the two said channels being identical and each including in series a first multiplier, a low pass filter and a second multiplier;
- means for generating a sine wave signal at a first reference frequency and means for generating a cosine wave signal at the same first reference frequency;
- means for delivering the said complex electrical signal to the first multiplier of the said first channel and to the said first multiplier of the said second channel;
- means for delivering the said sine wave signal to the said first multiplier of said first channel;
- means for delivering the said cosine wave signal to the said first multiplier of said second channel;
- means for delivering the output of each of the said first multiplier to the said low pass filter and from the said low pass filter to the said second multiplier;
- means for delivering a sine wave signal at a second reference frequency to the said second multiplier of said first channel;
- means for delivering a cosine wave signal at said second reference frequency to said second multiplier of said second channel;
- and summing means for adding the output signals from the said two channels to produce a resultant signal substantially free of components other than the selected frequency;
- the improvement comprising matched active low pass filters in the said two channels, each active filter including a pair of series filters each having an operational amplifier having its negative terminal connected to an input terminal through an input resistor and a blocking capacitor in series; a grounded positive terminal on said operational amplifier; a feedback resistor connecting the output terminal and the negative terminal of said operational amplifier; an output capacitor connecting the said output terminal of said operational amplifier with the junction between said input resistor and said blocking capacitor, and a filter output terminal between the said output capacitor and the said junction; the output terminal of the first filter being connected to the input terminal of the second filter.

* * * * *